(12) United States Patent
Gonzalez

(10) Patent No.: US 10,242,897 B2
(45) Date of Patent: Mar. 26, 2019

(54) MICRO-ENVIRONMENT CONTAINER FOR PHOTOVOLTAIC CELLS

(71) Applicant: SolarCity Corporation, San Mateo, CA (US)

(72) Inventor: Pablo Gonzalez, Fremont, CA (US)

(73) Assignee: SolarCity Corporation, San Mateo, CA (US)

( * ) Notice: Subject to any disclaimer, the term of this patent is extended or adjusted under 35 U.S.C. 154(b) by 468 days.

(21) Appl. No.: 14/985,284

(22) Filed: Dec. 30, 2015

(65) Prior Publication Data

US 2017/0170038 A1 Jun. 15, 2017

Related U.S. Application Data

(60) Provisional application No. 62/267,253, filed on Dec. 14, 2015.

(51) Int. Cl.
*H01L 21/677* (2006.01)
*H01L 21/67* (2006.01)
(Continued)

(52) U.S. Cl.
CPC .... *H01L 21/6773* (2013.01); *H01L 21/67201* (2013.01); *H01L 21/67303* (2013.01);
(Continued)

(58) Field of Classification Search
CPC ... B65D 85/30; B65D 85/48; H01L 21/37386; H01L 21/67; H01L 21/67039;
(Continued)

(56) References Cited

U.S. PATENT DOCUMENTS 4,995,430 A * 2/1991 Bonora ............ H01L 21/67373 141/383
5,570,987 A * 11/1996 McKenna ......... H01L 21/67373 414/416.01
(Continued)

FOREIGN PATENT DOCUMENTS

DE  20 2009 002 891 U1  4/2009
DE  10 2009 059 300 A1  6/2011
(Continued)

OTHER PUBLICATIONS

Donovan, Robert P., "Contamination-Free Manufacturing for Semiconductors and Other Precision Products", CRC Press, Mar. 14, 2001, Summary, 3 pages.
(Continued)

*Primary Examiner* — Anthony Stashick
*Assistant Examiner* — Kaushikkumar Desai
(74) *Attorney, Agent, or Firm* — Kilpatrick Townsend and Stockton LLP

(57) ABSTRACT

Devices and methods for transferring solar cells while maintaining a controlled environment are provided. Such devices can include a solar cell carrying pod adapted to support and maintain a stack of solar cells within a sealed micro-environment of inert gas. The solar cell carrying pod can further allow for ready removal of a solar cell carrier to facilitate automated transport of solar cells. The solar cell carrying pod can include a cover adapted to receive a solar cell carrier cassette securely mounted on a base that is sealably coupled with the cover to maintain solar cells within the carrier cassette in a sealed micro-environment for an extended period of time. The base can include a collet-operated gear train to facilitate unlocking and removal of the base from the cover in an automated process to facilitate large-scale solar cell fabrication.

16 Claims, 31 Drawing Sheets

(51) Int. Cl.
  *H01L 21/673* (2006.01)
  *H01L 21/687* (2006.01)
(52) U.S. Cl.
  CPC .. *H01L 21/67309* (2013.01); *H01L 21/67313* (2013.01); *H01L 21/67373* (2013.01); *H01L 21/67379* (2013.01); *H01L 21/67386* (2013.01); *H01L 21/67393* (2013.01); *H01L 21/67757* (2013.01); *H01L 21/67766* (2013.01); *H01L 21/67772* (2013.01); *H01L 21/67778* (2013.01); *H01L 21/68707* (2013.01)
(58) Field of Classification Search
  CPC ............. H01L 21/67201; H01L 21/673; H01L 21/67309; H01L 21/67772; H01L 31/02; H01L 31/50; H01L 21/67313; H01L 21/6732; H01L 21/67379; H01L 21/6773; H01L 21/67766; H02S 50/10
  See application file for complete search history.

(56) References Cited

U.S. PATENT DOCUMENTS

| | | | |
|---|---|---|---|
| 5,586,585 A * | 12/1996 | Bonora | H01L 21/67772 141/1 |
| 5,713,711 A * | 2/1998 | McKenna | H01L 21/67373 414/217.1 |
| 6,092,981 A * | 7/2000 | Pfeiffer | H01L 21/67303 206/710 |
| 6,418,979 B1 | 7/2002 | Lewis et al. | |
| 6,432,849 B1 * | 8/2002 | Endo | H01L 21/6732 206/710 |
| 7,669,717 B2 | 3/2010 | Sumi | |
| 8,474,626 B2 * | 7/2013 | Chiu | H01L 21/67379 206/454 |
| 2002/0015633 A1 * | 2/2002 | Fosnight | G03F 7/7075 414/222.01 |
| 2006/0244942 A1 | 11/2006 | Gregerson et al. | |
| 2007/0144118 A1 | 6/2007 | Alvarez, Jr. et al. | |
| 2007/0183869 A1 * | 8/2007 | Cho | H01L 21/67259 414/217 |
| 2007/0231110 A1 * | 10/2007 | Akiyama | H01L 21/67379 414/217 |
| 2008/0156679 A1 * | 7/2008 | Bonora | B65D 81/2076 206/320 |
| 2011/0024325 A1 | 2/2011 | Winderlich | |
| 2013/0056485 A1 | 3/2013 | Burns et al. | |
| 2014/0202921 A1 * | 7/2014 | Babbs | H01L 21/67775 206/710 |
| 2015/0214084 A1 | 7/2015 | Schneider et al. | |
| 2015/0311103 A1 | 10/2015 | Bando et al. | |
| 2018/0056291 A1 * | 3/2018 | Bores | H01L 21/67373 |

FOREIGN PATENT DOCUMENTS

| | | |
|---|---|---|
| DE | 10 2010 005 202 A1 | 7/2011 |
| WO | 2012/058676 A2 | 5/2012 |
| WO | 2012/135863 A2 | 10/2012 |

OTHER PUBLICATIONS

Pai, W., et al., "On the Design of an Innovative Latch Mechanism in SMIFed Wafer Containers", *Journal of Mechanics*, Sep. 2003, vol. 19, Issue 3, The Society of Theoretical and Applied Mechanics, R.O.C., Abstract only, 4 pages.

* cited by examiner

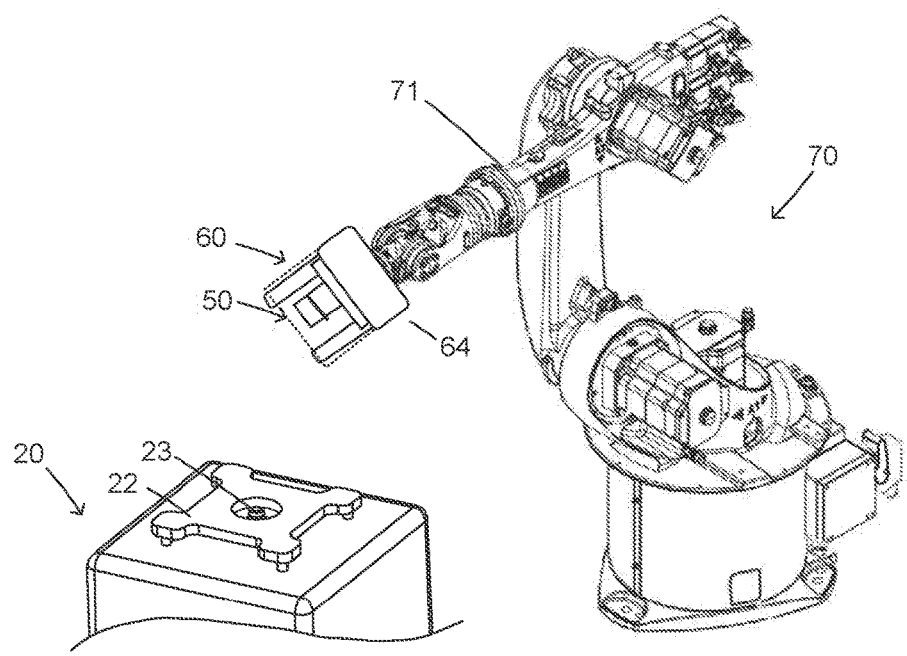
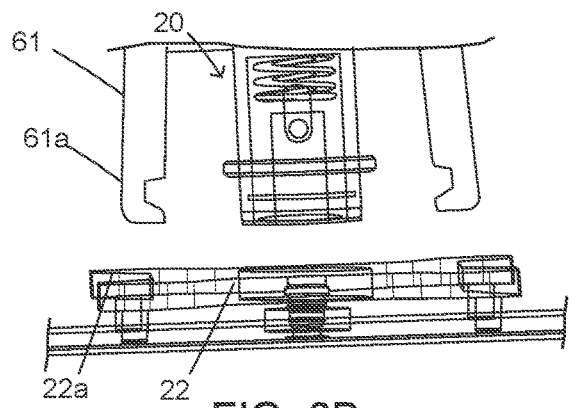
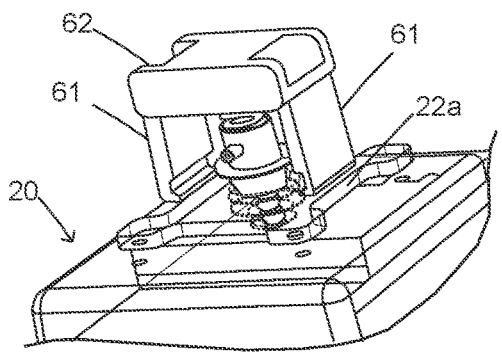
FIG. 6A
FIG. 6B
FIG. 6C

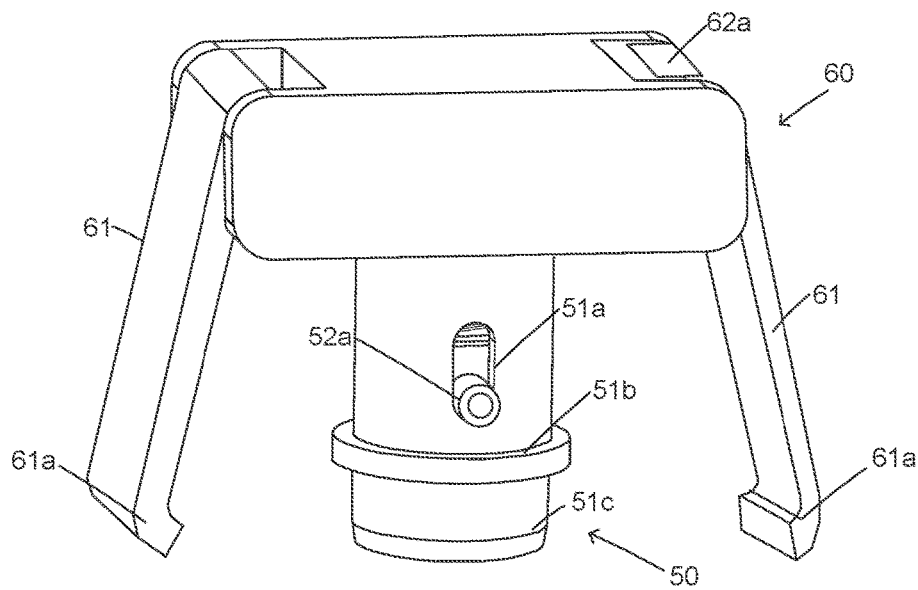
FIG. 8A
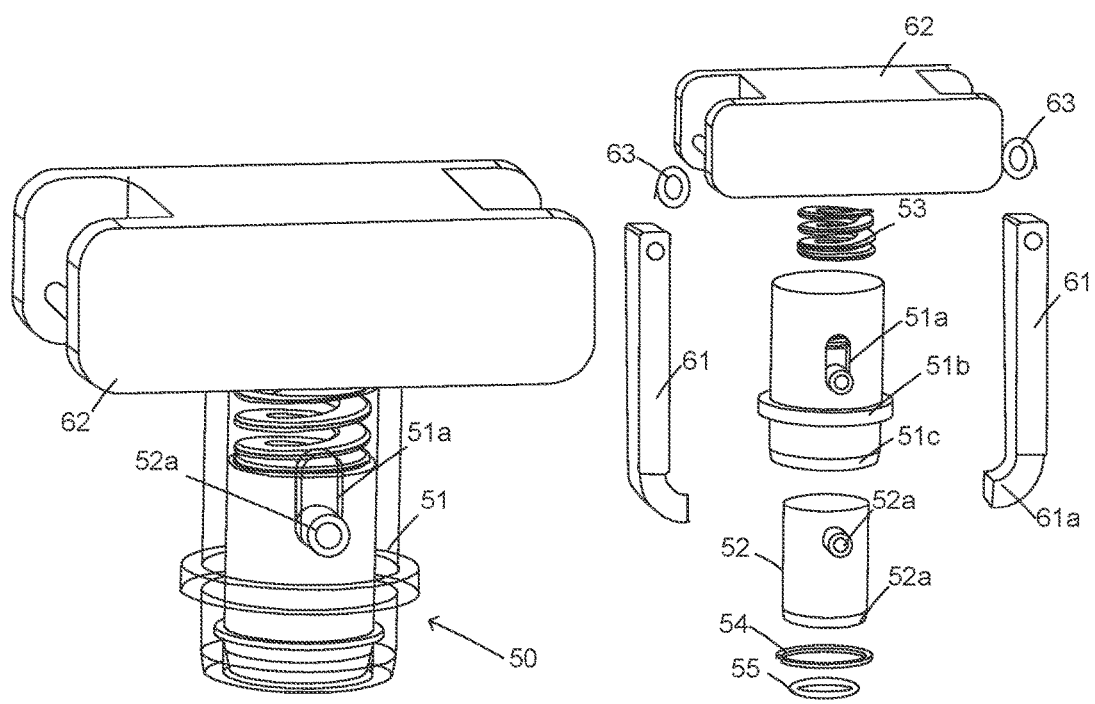
FIG. 8B
FIG. 8C

MICRO-ENVIRONMENT CONTAINER FOR PHOTOVOLTAIC CELLS

CROSS REFERENCE TO RELATED APPLICATION

This claims the benefit of priority of U.S. Provisional Patent Application No. 62/267,253 filed on Dec. 14, 2015, the entire contents of which are incorporated herein by reference.

This is related to U.S. Non-Provisional patent application Ser. No. 14/985,294 and Ser. No. 14/985,260; each of which is filed concurrently herewith and incorporated herein by reference in its entirety.

FIELD OF THE INVENTION

This relates to devices, systems and methods that facilitate transfer and storage of solar cells. More specifically, this is related to containers that store photovoltaic cells while maintaining a sealed protective micro-environment and allowing ease in automated transfer of solar cells between the containers and solar cell fabrication line to facilitate large-scale production of solar cells.

BACKGROUND

Advances in photovoltaic technology and, thus, solar panels have helped solar energy gain mass appeal among those wishing to reduce their carbon footprint and decrease their monthly energy costs. However, solar panel fabrication typically includes various manual processes, which can be time-consuming and error-prone and make it costly to mass-produce reliable solar panels.

Conventional approaches for fabricating solar cells often require the entire fabrication process for a particular solar cell to be performed with minimal delays between process steps since even brief exposure to ambient air triggers degradation of solar cell components by oxidation. If such delays are unavoidable, solar cell components are typically placed on a tray and stored in a large storage container that must be purged of ambient air and filled with an inert gas such as nitrogen. Even this approach, however, can result in some degradation of solar cell components since purging a large storage container can be time-consuming and studies have shown that measurable degradation occurs within six minutes of exposure to ambient environment. In addition, because storage of solar cell components typically utilizes a high-grade of Nitrogen, such purging and filling of large storage containers can become cost prohibitive, thereby limiting the number of solar cells that can be efficiently transferred and stored without degradation occurring. These difficulties make fabrication of solar cells challenging because large-scale production may require process steps to be performed at different times and/or locations necessitating delays between process steps. Therefore, it would be desirable to develop containers that provide efficient storage of solar cell components while maintaining a protective micro-environment for stored solar cells. It would be further desirable if such systems and methods allowed for quick and efficient automated transfer of large volumes of solar cells between locations to facilitate large-scale production of solar cells.

BRIEF SUMMARY

In one aspect, the disclosure provides a solar cell carrying container or pod that can include a cover and a base removably coupleable with a locking mechanism. The cover can be adapted to receive a carrier cassette carrying a stack of solar cells between the cover and the base. The base can be adapted to removably and sealably couple with the cover so as to maintain a sealed micro-environment of inert gas about the stack of solar cells. In various embodiments, the pod maintains a sealed micro-environment of an inert gas at a partial vacuum or a positive pressure for an extended period of time such as one week or more, for example at least 60 days.

In various embodiments, the locking mechanism can be incorporated into the base, which facilitates locking/unlocking and removal of the base in an automated transfer system. The system can include an elevator platform base that supports the removable base. In various embodiments, the locking mechanism can include a locking ring rotatable between a locked position and an unlocked position. The locking ring can include a plurality of locking blades that engage with a corresponding interface of the cover. The locking mechanism can be configured so that when the locking ring is in the locked position, the base and cover are sealably coupled together and, when the locking ring is in the unlocked position, the base is removable from the cover. The corresponding interface of the cover can include one or more slots near a bottom portion of the cover adjacent the base when sealingly coupled thereto that engage the rotating locking ring. The rotating locking ring can include at least four locking blades that interface with at least four corresponding slots distributed about the bottom portion of the cover adjacent the base when sealingly coupled thereto.

In various embodiments, the pod can include a locking ring that is engageable with a gear system within the base and configured so that operation of the gear system rotates the locking ring between the locked and unlocked position. The gear system can be collet-operated so that insertion and expansion of a collet engages a corresponding collar within the gear system so that rotation of the collet operates the gear system to lock and unlock the base from the cover within an automated process. The collet can be incorporated into the elevator base or into various other components within an automated transfer system.

In various embodiments, the cover can include a valve for introduction of the inert gas and/or control of the micro-environment established within the cover when sealingly coupled with the base. The cover can further include a plenum in fluid communication with the valve. The plenum provides a chamber for accumulation of inert gas for controlled distribution through the sealed solar cell carrying pod. The plenum can be defined in part by a plenum diffuser that extends along a substantial length of the carrier so as to distribute the inert gas among the plurality of solar cells contained within the carrier when the inert gas is introduced through the plenum. The plenum can include an upper plenum adjacent the valve and a lower elongated plenum defined in part by the plenum diffuser. In some embodiments, the plenum can be defined in part by an inside surface of the cover.

In various embodiments, the plenum diffuser can be movable between a first and second position, the first position being spaced away from the solar cells within the carrier to facilitate receiving of the carrier within the cover and the second position the plenum diffuser moves in closer proximity to the stack of solar cells within the carrier cassette so to occupy excess space. This second configuration allows the plenum diffuser to inhibit movement of the solar cells within the carrier when the base and cover are in the locked position. The plenum diffuser can extend distally from the upper plenum and be pivotally coupled to the cover so as to pivot between the first and second positions. The plenum diffuser can include one or more pins extending distally from a distal end of the diffuser that engage the base when coupled to the cover so that engagement of the pins and the base pivot the plenum diffuser to the second position so that the stack of solar cells are securely positioned in the cassette when stored.

In another aspect, the disclosure provides a solar cell carrying pod that can include a base having gear driven locking mechanism operable from an underside thereof and a cover removably coupled to base. The cover can be sealably lockable to the base by operation of the locking mechanism. A solar cell carrier cassette can be removably coupled between the base and cover. The cassette can be securely coupled to the base. The pod can further include a plenum within the cover. The plenum can include a movable plenum diffuser that moves toward the stack of solar cells in the carrier when the base is coupled to the cover to reduce a gap between the solar cell carrier and the gas plenum and secure the solar cells when stored in the sealed pod.

In yet another aspect, the disclosure provides a solar cell carrying pod that can include a base having a collet and a gear train operated by rotation the collet, a lock within the base that is operable by the gear train, and a cover removably coupled to the base. The cover can be locked to the base by operation of the gear train while a solar cell carrier is coupled between the base and the cover. In various embodiments, the pod further includes a moveable gas plenum coupled to the carrier. The carrier can be defined with an opening that cooperates with the collet of the base so that expansion of the collet holds the carrier to the base during operation of the gear train with the collet. The moveable gas plenum can be configured so that the gas plenum is moved by operation of the gear train to reduce a gap between the solar cell carrier and the gas plenum.

In various embodiments, the solar cell carrying pod can further include a seal between the base and cover that is adapted to maintain a sealed micro-environment of inert gas about the stack of solar cells for an extended period of time when the base is sealingly coupled with the cover. The extended period can be for a period of days, weeks or months, typically at least 60 days. In various embodiments, the carrier is adapted to support a plurality of solar cells within and can include a pair of end plates having one or more interfacing features. The interfacing feature can include coupling features, alignment features, handling features or any combination thereof. The coupling features can be adapted for removably securing the carrier to the base such that, when secured, removal of the base from the cover facilitates retraction of the carrier from within the cover to facilitate loading or unloading of the carrier. The end plates of the carrier cassette can further include an identifier, such as an RFID chip, on one or both end plates to facilitate identification and tracking of the carrier cassette while within the sealed pod during storage or during transport of the solar cells in the system described herein.

BRIEF DESCRIPTION OF THE DRAWINGS

FIGS. 6A-6C illustrate a robotic arm of the system and associated gripper and nozzle mechanism for facilitating transport of the solar cell carrying pod and control of a microenvironment within each solar cell carrying pod via the nozzle in accordance with various embodiments.

FIGS. 8A-8E illustrate various views of a gripper and nozzle device of the robotic arm in accordance with various embodiments.

DETAILED DESCRIPTION

The present disclosure seeks to ameliorate some if not all of the shortcomings of the prior art by use of a solar cell carrying pod that allows for sealed storage of solar cells while maintaining a micro-environment of inert gas for an extended period of time. The solar cell carrying pod can further allow for ready removal of a solar cell carrier of the pod to facilitate quick and efficient transfer of solar cell components within a load lock solar cell transfer system. Advantageously, the solar cell carrying pods and associated methods of use described herein are amenable to automation so that the solar cells can be maintained in a controlled environment of inert gas during transport and storage while minimizing or eliminating costly purging. These aspects provide for more efficient transfer and storage of large volumes of solar cells during large-scale production of solar cells.

Referring now to FIGS. 1A-20B, these figures illustrate various views of an exemplary solar cell transport system and associated components that facilitate transport of solar cells via one or more solar cell carrying pods in accordance with various embodiments.

Figure 1A:
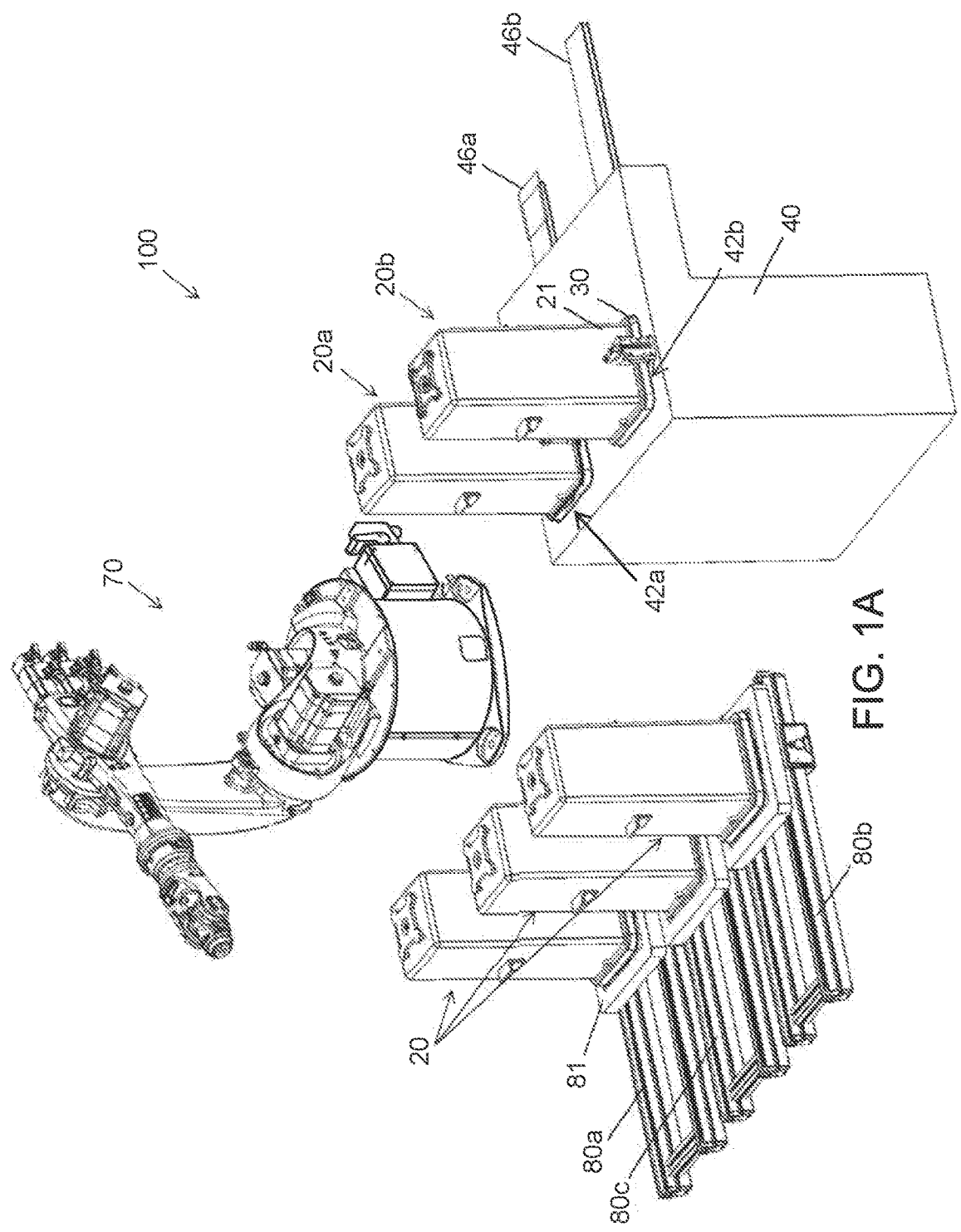
FIG. 1A illustrates a load lock solar cell transfer system for maintaining a controlled environment during transport of solar cells in accordance with various exemplary embodiments of the invention.
Figure 1B:
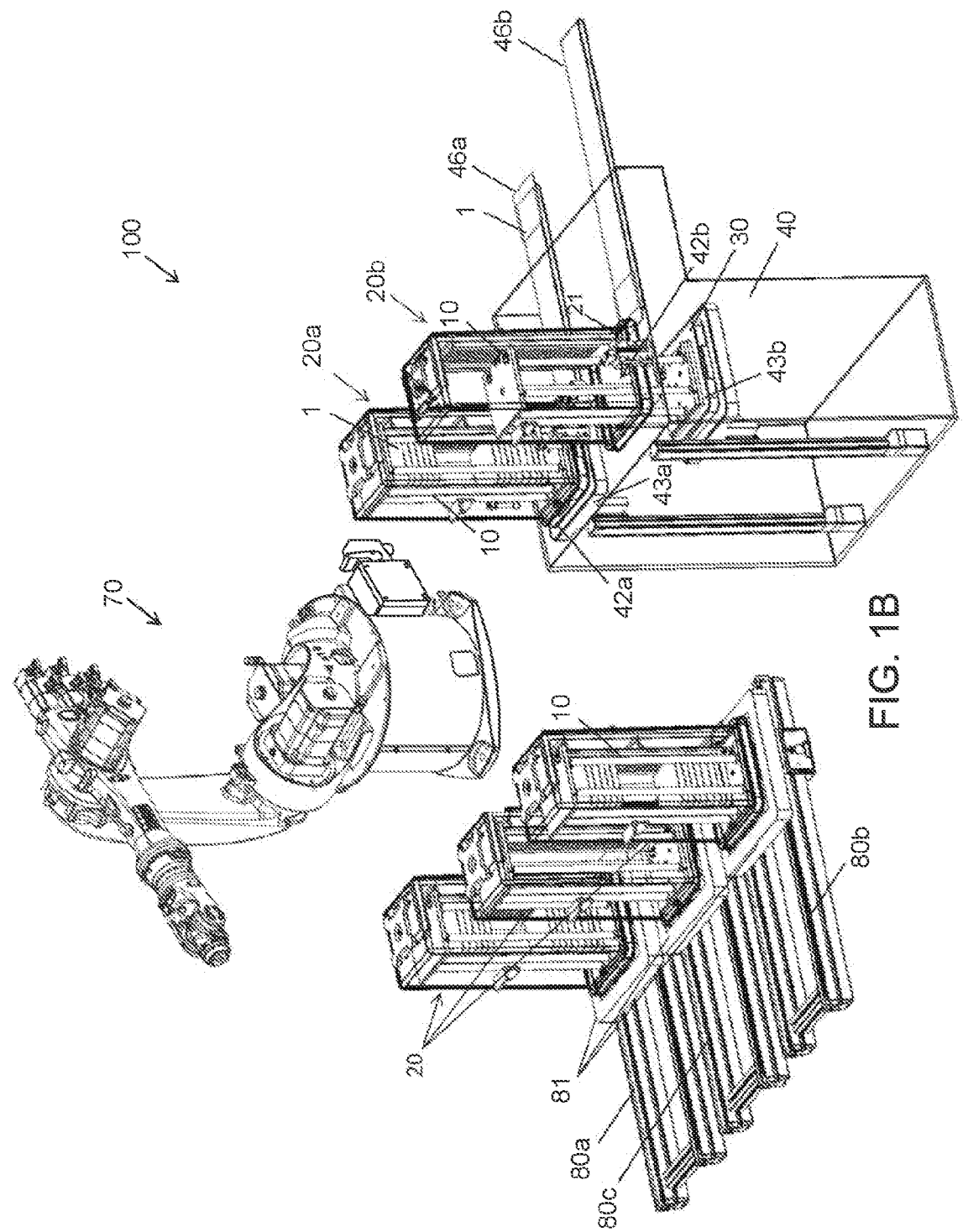
FIG. 1B illustrates the load lock system of FIG. 1A with the housings of the solar cell carrying pod and tank receptacle shown as transparent to better show internal components.

FIGS. 1A and 1B show an overview of an automated load lock solar cell transfer system 100. System 100 includes tank receptacle 40 having incoming conveyor 46a and outgoing conveyor 46b for conveying solar cells between a process flow tube (not shown) and solar carrying pods 20a, 20b via the tank receptacle 40. Detailed views of select portions of system 100 are shown in the subsequent figures.

FIGS. 2A, 2B, 2C and 2D illustrate a perspective, front, side and top views of tank receptacle 40 with solar cell carrying pods 20a, 20b mounted thereon to facilitate transport of solar cells between the respective pods and the fabrication line.

Figure 3A:
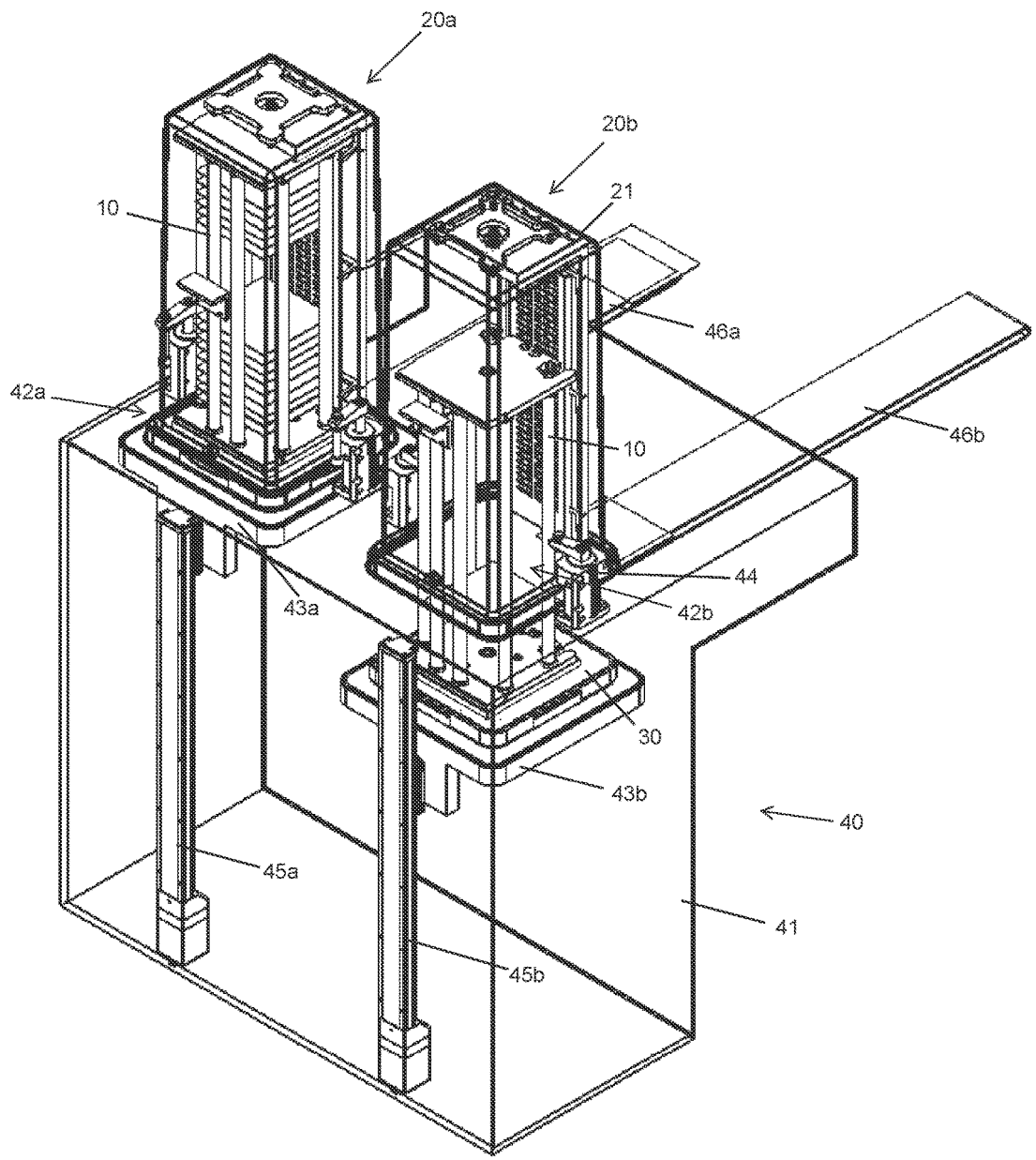
FIGS. 3A-3B illustrate various views of the tank receptacle and attached solar cell carrying pods of FIG. 2A with the housings of the tank receptacle and solar cell carrying pods shown as transparent to better show internal components.

As can be seen in the detailed view of FIG. 3A, solar cell carrying pods 20a, 20b are sealingly coupled to ports 42a, 42b, respectively, on tank receptacle 40. Each solar cell carrying pod 20a, 20b includes a cover 21 and a removable base 30 with a solar cell carrier cassette 10 securely mounted thereon, each cassette 10 being adapted to hold a stack of solar cells or solar cell components. Cassette 10 is withdrawn into an interior of tank receptacle 40 by elevator platform 43 on which solar cell carrying pod base 30 is coupled to facilitate loading and unloading of the respective cassette. Each solar cell carrying pod 20 is configured to support a micro-environment of inert gas (e.g. Nitrogen) to maintain the integrity of any solar cell components stored within. Since cassette 10 occupies a substantial majority of the internal cavity of solar cell carrying pod 20, the amount of the inert gas required to establish the microenvironment is minimized. Each solar cell carrying pod 20 can be disassembled, such as through a removable door, by a mechanism within tank receptacle 40 that withdraws cassette 10 into tank receptacle 40 while maintaining a sealed microenvironment. Typically, one or more seals circumscribe each of ports 42a, 42b in tank receptacle 40 so as to sealingly engage with the bottom of cover 21 to maintain the microenvironment and minimize any loss of the inert gas.

In various embodiments, system 100 includes a control unit that coordinates movement of conveyors 46a, 46b—both conveying movement and extending movement of the conveyors toward elevators 43a, 43b to facilitate loading or unloading of solar cells. In the embodiment shown here, tank receptacle 40 includes a pair of ports to which a pair of solar cell carrying pods 20a, 20b are connected. The pair of ports include incoming port 42a and outgoing port 42b. Incoming port 42a is used for unloading solar cells from carry pod 20a to conveyor 46a for entry into the solar cells into the fabrication line; these solar cells are considered incoming solar cells. Outgoing port 42b is used for loading solar cells exiting the fabrication line via conveyor 46b into carry pod 20b, as shown in FIG. 1B; these solar cells are considered outgoing solar cells. This configuration allows for loading of one or more solar cells from outgoing conveyor 46b to cassette 10 withdrawn into tank receptacle by elevator 43b. This process also allows unloading of one or more incoming solar cells from cassette 10 of pod 20a withdrawn into tank receptacle 40 by elevator 43a.

Figure 3B:
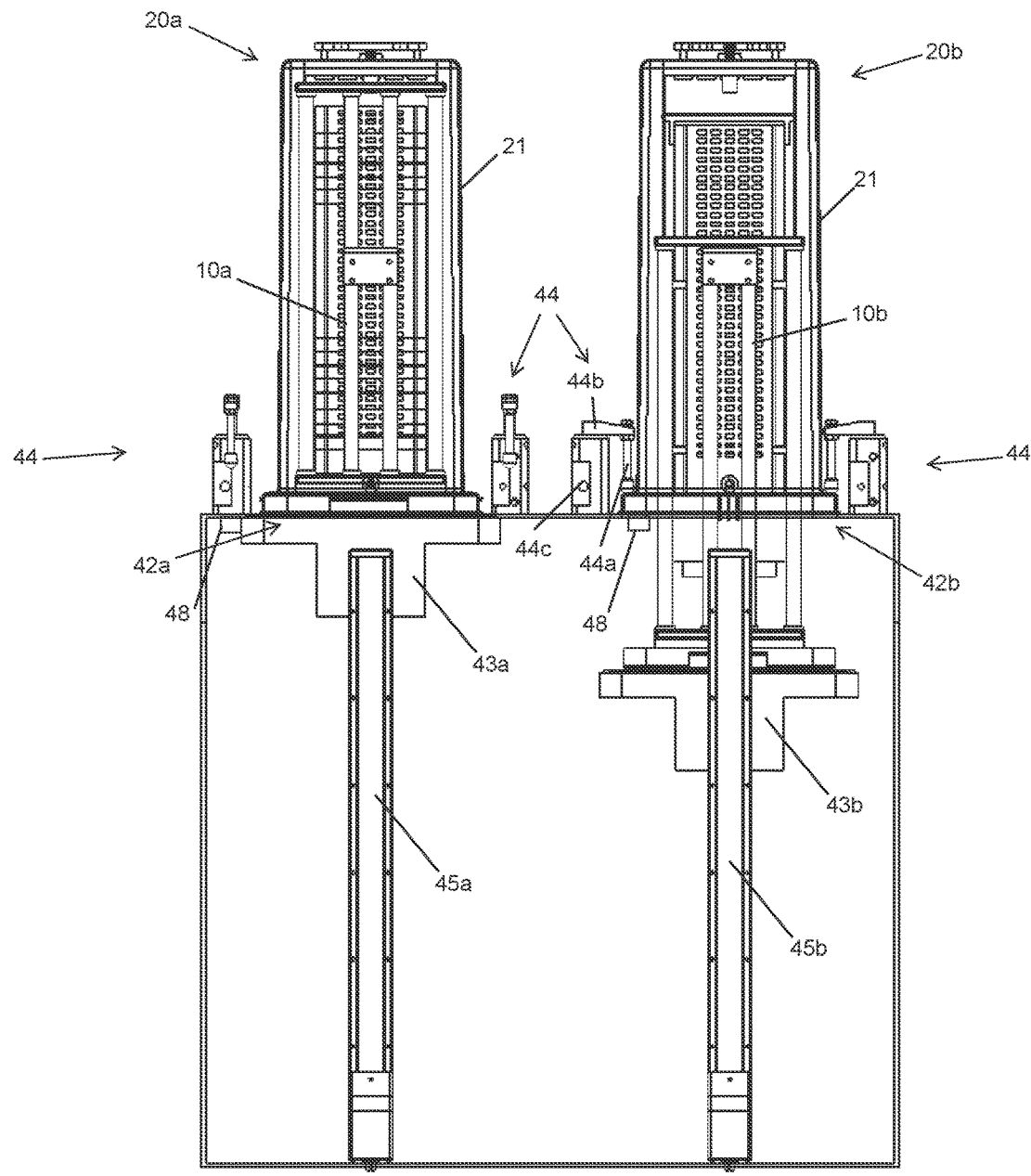

As shown in FIG. 3B, solar cell carrying pod 20a contains cassette 10, which is loaded with incoming solar cells. Solar cell carrying pod 20a is mounted to the incoming port for unloading of solar cells onto incoming conveyor 46a for conveyance into the process flow within the tube attached to tank receptacle 40. Solar cell carrying pod 20b is mounted on the outgoing port of tank receptacle 40 and its cassette 10 is withdrawn into tank receptacle 40 to facilitate loading of outgoing solar cells into cassette 10 by coordinated movement of respective elevator platform 43b and outgoing conveyor 46b.

Staging tracks 80a, 80b, 80c, shown at left in FIGS. 1A and 1B, can be used for staging of solar cell carrying pods 20 to facilitate large-scale loading and unloading of outgoing and incoming solar cells from multiple solar cell carrying pods, such as by use of an automated robotic arm 70 to facilitate repeated cycling of full and empty solar cell carrying pods. Solar cell carrying pods 20 may be supported on pallets 81 having a recess or molded portion for supporting a pod base in a particular position and/or orientation. Pallet 81 can be formed with a similar recess or molded feature as that shown on the elevator platforms 43 so as to fittingly receive an underside of each of solar cell carrying pods 20. Each of staging racks 80 can be configured so that pallets 81 readily slide, or are automatically conveyed to a particular position so that the robotic arm can process multiple solar cell carrying pods for loading and/or unloading by repeating a pick-up or drop-off operation at the same position along the respective staging track.

Each staging rack may be designated for a particular purpose so as to be amenable to automation for large-scale solar cell transfer. In this embodiment, staging track 80a carries one or more solar cell carryings pods 20 with cassettes loaded with incoming solar cells so that each pod can be picked-up, in turn, by robotic arm and attached to the incoming port 42a of receptacle tank 40 for unloading of incoming solar cells. After unloading, the empty cassette 10 can be raised into the respective solar cell carrying pod and sealed, after which the empty pod can be placed by the robotic arm onto staging track 80*c*. Any empty solar cell carrying pods on staging track 80*c* can be picked-up by robotic arm 70 and positioned onto and attached to outgoing port 42*b* on receptacle tank 40 for loading of outgoing solar cells. After outgoing solar cells received from the process flow tube are conveyed and loaded into the cassette 10 of solar cell carrying pod 20*b*, the full or partially full cassette 10 is raised into the pod by elevator 43*b* and sealed, then placed by robotic arm 70 onto staging track 80*b*.

Full or empty pods can be removed from or placed on any of staging tracks, as needed, for storage or transfer of incoming or outgoing solar cells, either manually or by various other automated processes. The above described process is advantageous as it allows for repeated transfer of incoming solar cells and outgoing solar cells between numerous solar cell carrying pods and the process flow tube as needed for large scale solar cell fabrication. While dedicated incoming and outgoing ports and conveyers are utilized here to facilitate large scale transfers of solar cells. It is appreciated that these concepts can be used alternatively to facilitate loading and unloading of outgoing and incoming solar cells with a single port.

Figure 2A:
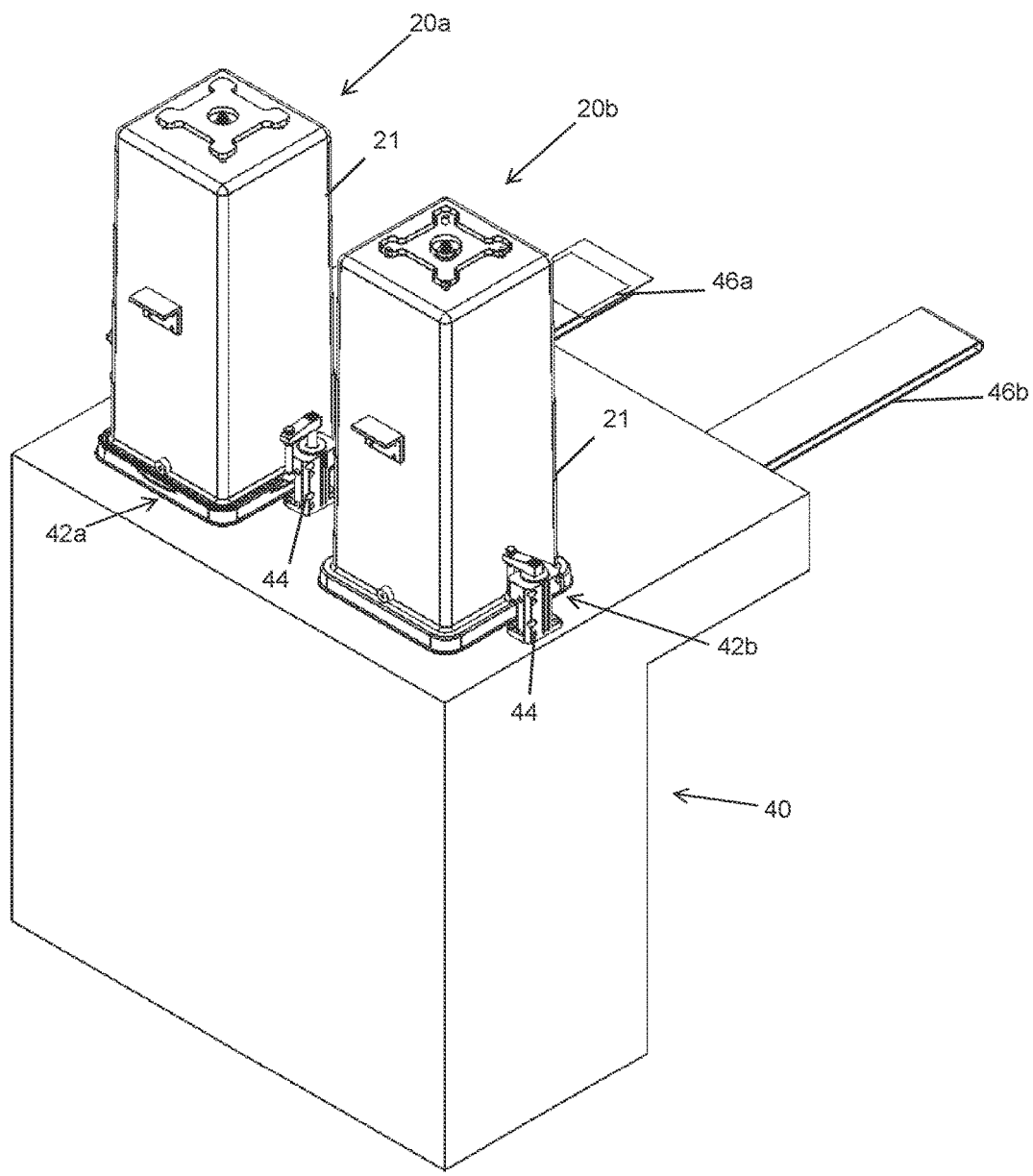
FIGS. 2A-2D illustrate various views of a tank receptacle attached to both an incoming solar cell carrying pod and an outgoing solar cell carrying pod to facilitate transport of solar cells from the processing tube via incoming and outgoing conveyers in accordance with various exemplary embodiments of the invention.
Figure 2B:
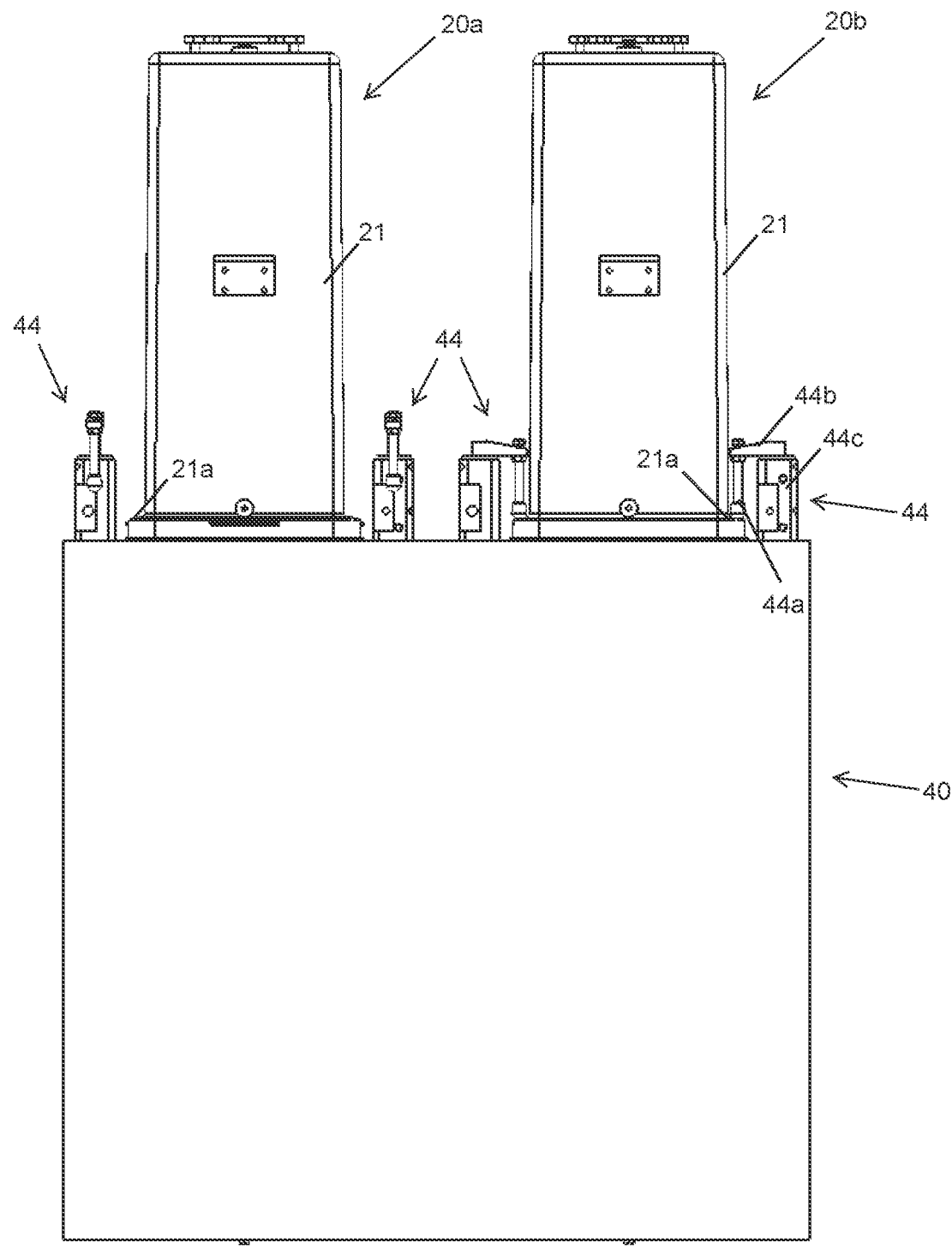
Figure 2C:
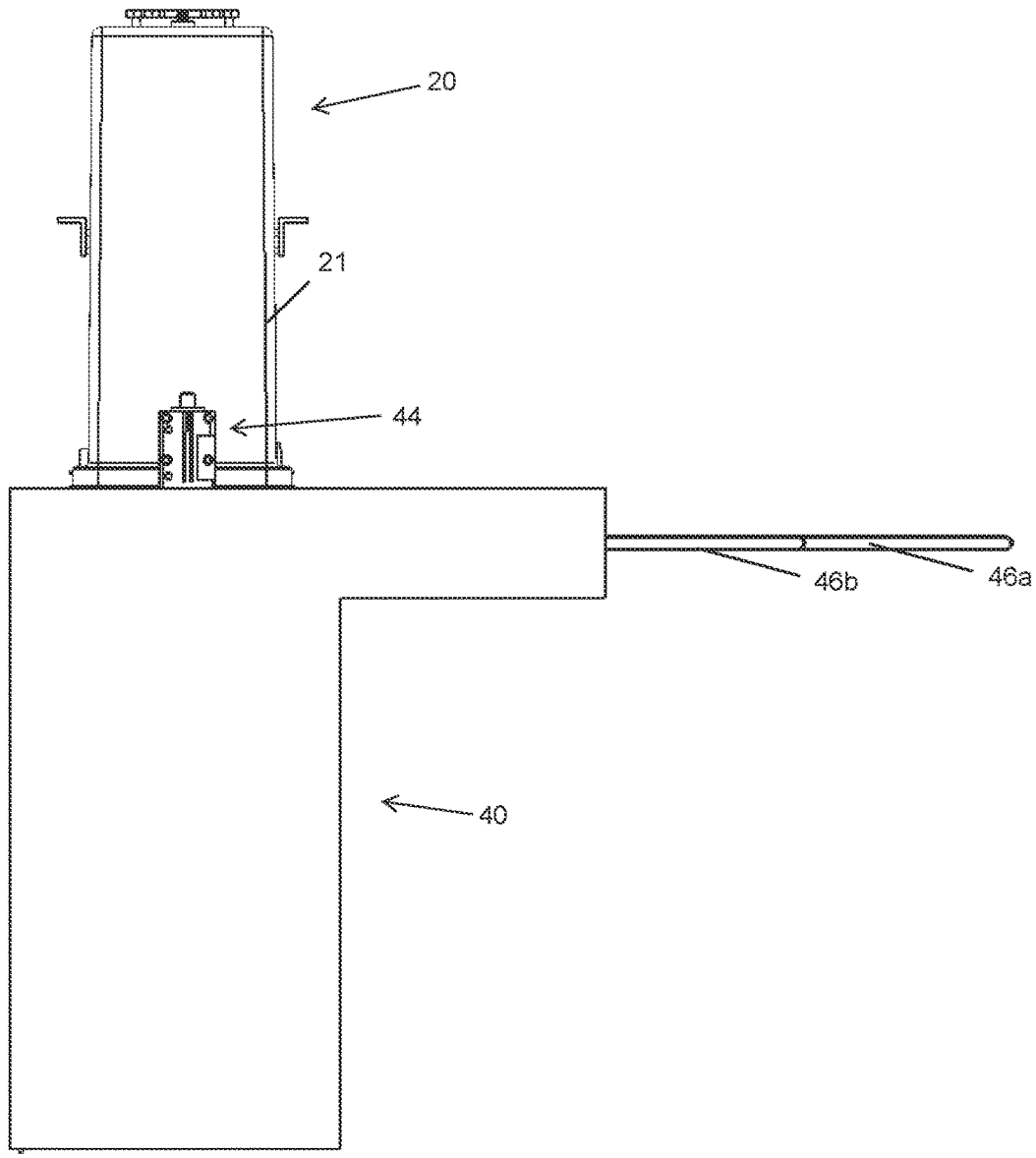
Figure 2D:
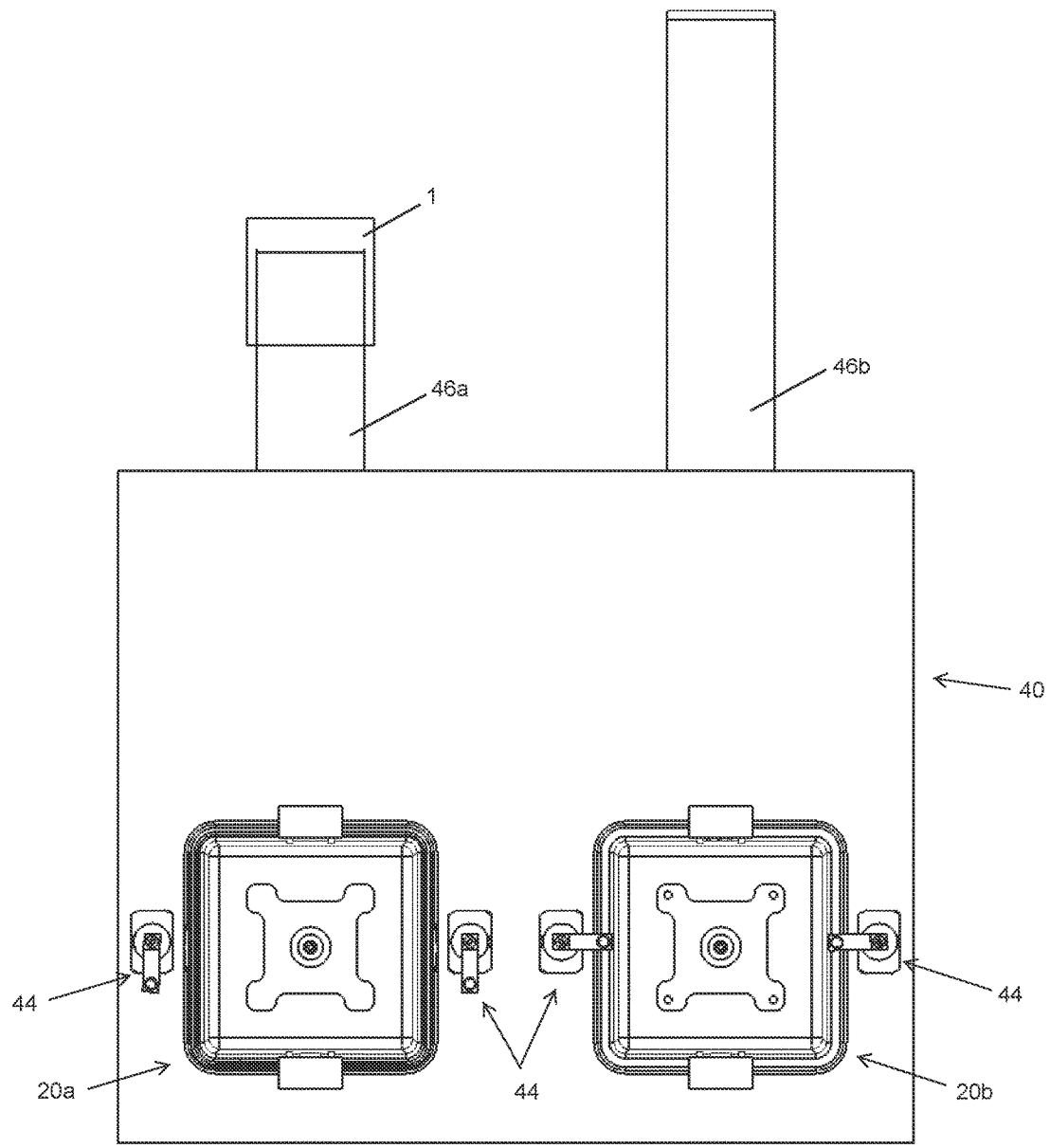

As shown in FIGS. 2A-D and 3A-3B, tank receptacle 40 includes a pair of clamping mechanisms 44 on each side of the incoming port 42*a* and outgoing port 42*b* by which each solar cell carrying pod 20 is sealingly coupled to the respective port. The system can include one or more sensors (not shown), such as a pressure sensor, RFID detector, or proximity sensor, to determine when solar cell carrying pod 20 is properly positioned over a respective port. FIG. 2B shows a front view of tank 44 with clamping mechanisms 44 adjacent each port, before clamping mechanisms 44 adjacent solar cell carrying pod 20*a* are rotated to seal cover 21 to tank receptacle 44 and after clamping mechanisms 44 adjacent solar cell carrying pod 20*b* are rotated into place sealingly coupling cover 21 to tank receptacle. This same configuration is shown in the side view of FIG. 2C and the overhead view in FIG. 2D.

FIGS. 3A-3B show a perspective view and a front view of the same configuration in FIG. 2A with the housings of tank receptacle 40 and each solar cell carrying pod cover 21 shown as transparent to better illustrate internal components. FIGS. 3C and 3D show detail views of clamping mechanism 44 in the open configuration and the clamped configuration, respectively. In the embodiments shown in FIG. 3B, each clamping mechanism 44 includes a pressing finger 44*a*, extending from a pivoting arm 44*b*, that is rotated by a clamping mechanism base 44*c* mounted on the top of receptacle tank 40. The pressing finger 44*a* can be moved distally by lowering of the pivoting arm 44*b*. Actuated to the clamped position by clamping mechanism base 44, a distal tip of the finger 44*a* pressingly engages against an outer surface of an outer bottom edge of the solar cell carrying pod cover so as to provide sufficient force to sealingly engage a bottom edge of the cover with the top surface of receptacle tank housing adjacent the respective port.

Figure 4A:
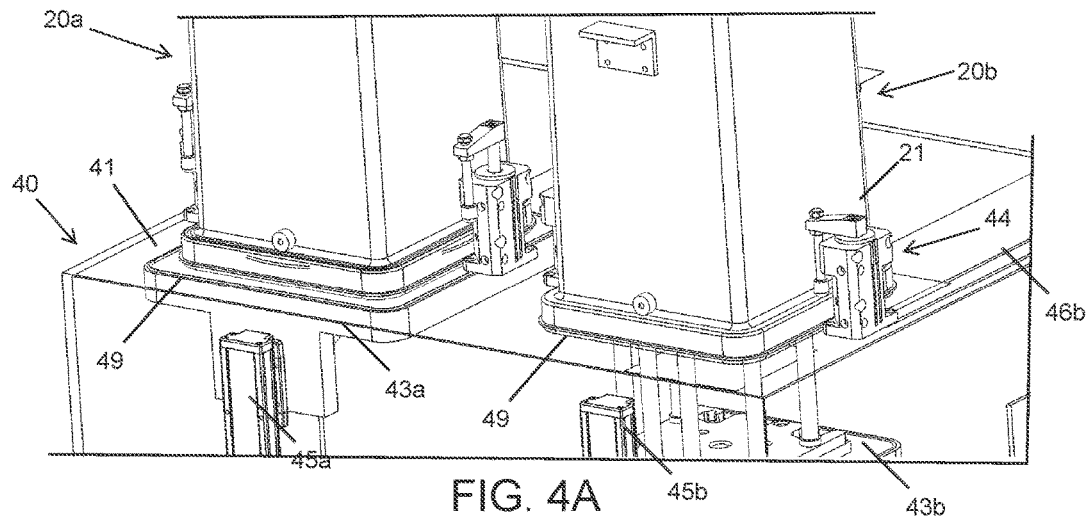
FIGS. 4A-4B illustrate detailed views of a clamping mechanism to facilitate sealing attachment of the pod covers of the solar cell carrying pods with each of the incoming and outgoing ports on the receptacle housing to facilitate loading and unloading of solar cells in accordance with various embodiments.
Figure 4B:
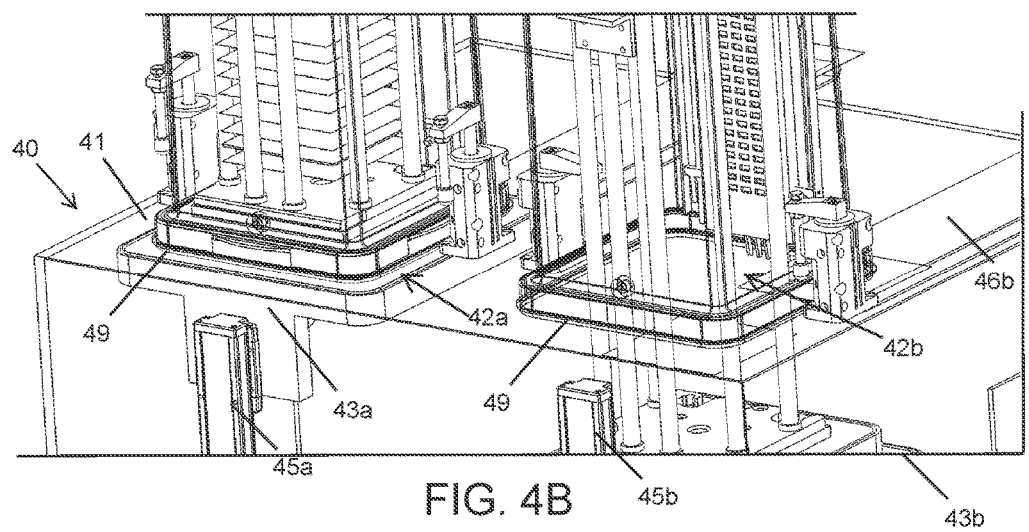

As shown in FIGS. 4A-4B, a lip seal 49 circumscribes each port 42*a*, 42*b* to provide an air-tight seal between cover 21 and the housing 41 of tank receptacle 40, even under a positive pressure within the receptacle tank 40. The distal tip of the finger 44*a* may be defined in a bulbous shape to facilitate sliding and/or engagement with the outer surface of the pod. The tip can also be formed from a softened material, such as rubber or silicone, to further facilitate sliding and engagement with the pod cover. In various embodiments, the bottom edge of the pod cover includes a sloped or ramped surface so that the distal end of the finger 44*a* of the sealing mechanism can be rotated laterally to engage the outer surface of the pod without lowering or pivoting arm 44*b*.

Figure 4C:
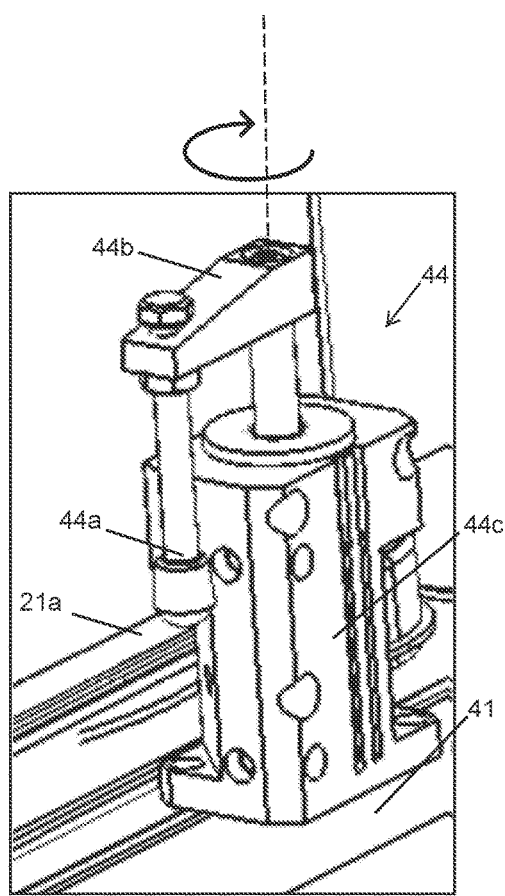
FIGS. 4C-4D illustrate detailed views of a clamping mechanism in an open and clamped configuration, respectively, in accordance with various embodiments.
Figure 4D:
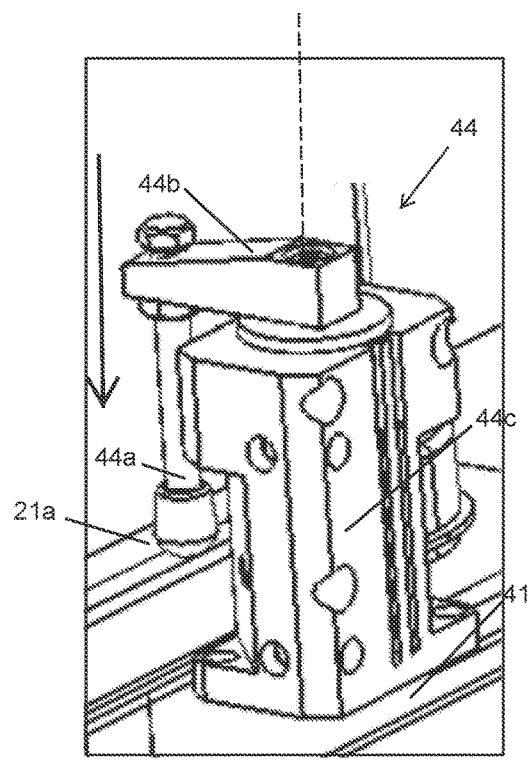

FIGS. 4C and 4D show detailed views of clamping mechanism 44 in the open and clamped configurations, respectively. As can be seen in FIG. 4C, in the unclamped position, the pressing finger 44*a* extends distally from movable arm 44*b* and is spaced away from pod cover bottom edge 21*a*. Once the pod is properly positioned, clamping actuator base 44*c* effects the clamped position. In this embodiment, such an actuation includes rotating arm 44*b* about its vertical axis and swings pressing finger 44*a* over pod cover bottom edge 21*a*, then lowers arm 44*b* vertically downwards so as to press finger 44*a* against pod cover bottom edge 21*a* sufficiently to sealingly couple pod cover 21 against tank receptacle housing 41.

In this embodiment, clamping mechanism base 44*c* includes a motor driven actuator, such as a rotary actuator or linear actuator (e.g. servo motor), to effect pivoting movement of arm 44*b* so as to pressingly engage the finger 44*a* against the ridge 21*a* of cover 21, as can be seen in FIG. 2B. The motor can be coupled with a controller that pivots finger 44*a* towards pod 20 in response to an output from a sensor 48 (e.g. pressure, RFID detection) that indicates the presence of the pod 20 placed over port. While the clamping mechanisms in this embodiment utilize a downward facing finger that swings laterally into place, it is appreciated that the clamping mechanism can be configured to utilize various other sealing mechanisms suitable for sealing.

As shown in FIG. 4B, once the solar cell carrying pod cover is sealingly coupled to the receptacle tank 40 over a respective port, elevator platform 43*b* within tank receptacle 40 couples with base 30 of solar cell carrying pod 20*b* and effects unlocking of base 30 from solar cell carrying pod cover 21. Elevator 43*b* then lowers along track 45*b* to retract pod base 30 along with the attached cassette 10 into tank receptacle 40 by moving elevator platform 43 downward along elevator track 45, as shown in FIG. 4B. Once in a desired position, loading and unloading of solar cells or solar cell components within cassette 10 is facilitated by coordinated movement of the elevator platform and the conveyor along which the solar cell components are conveyed.

Figure 5A:
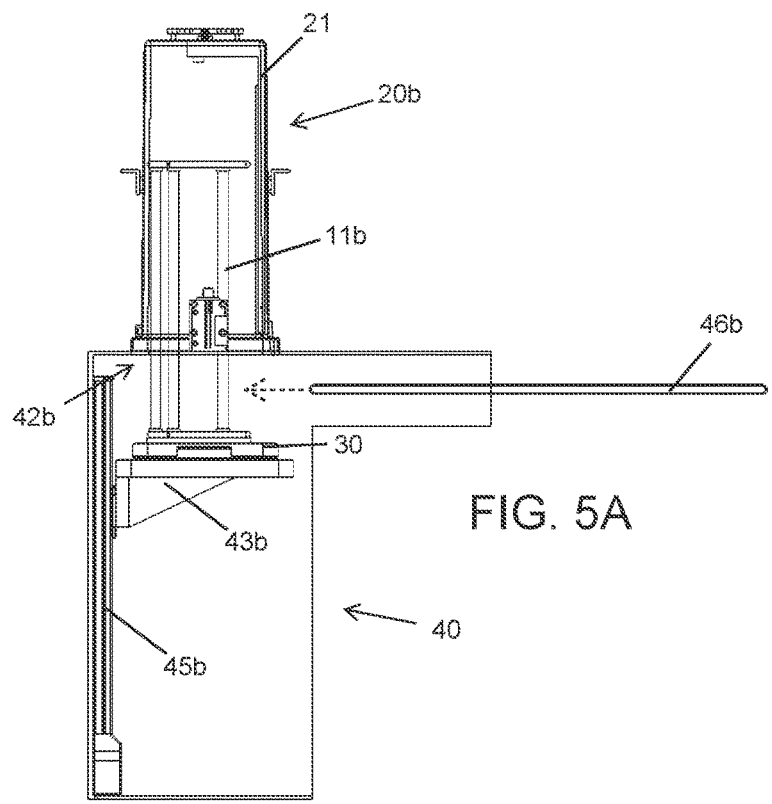
FIGS. 5A-5D illustrate sequential views of loading outgoing solar cells in a cassette of an attached solar cell carrying pod via coordinated movement of the elevator and an outgoing conveyor in accordance with various embodiments.
Figure 5B:
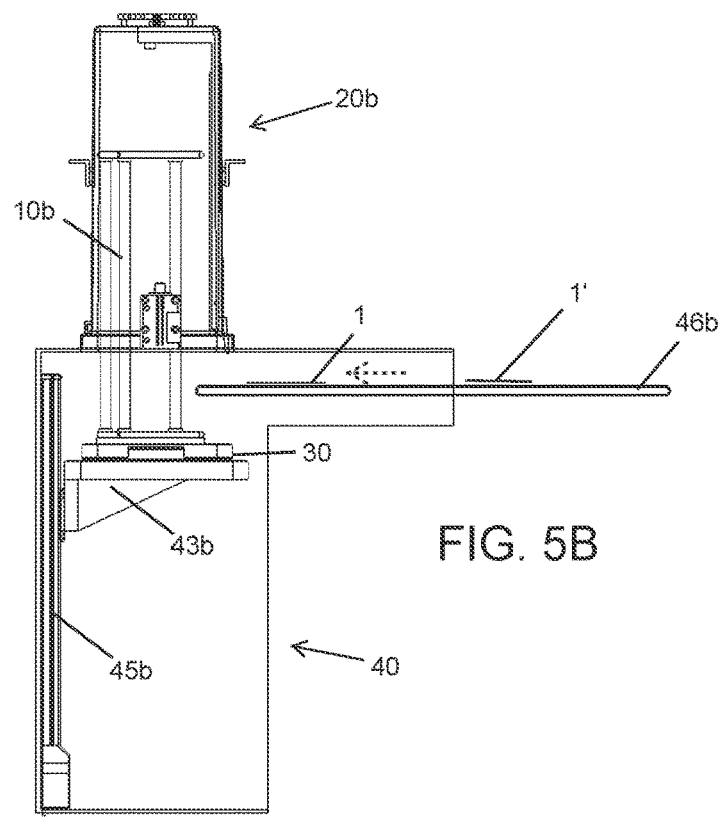
Figure 5C:
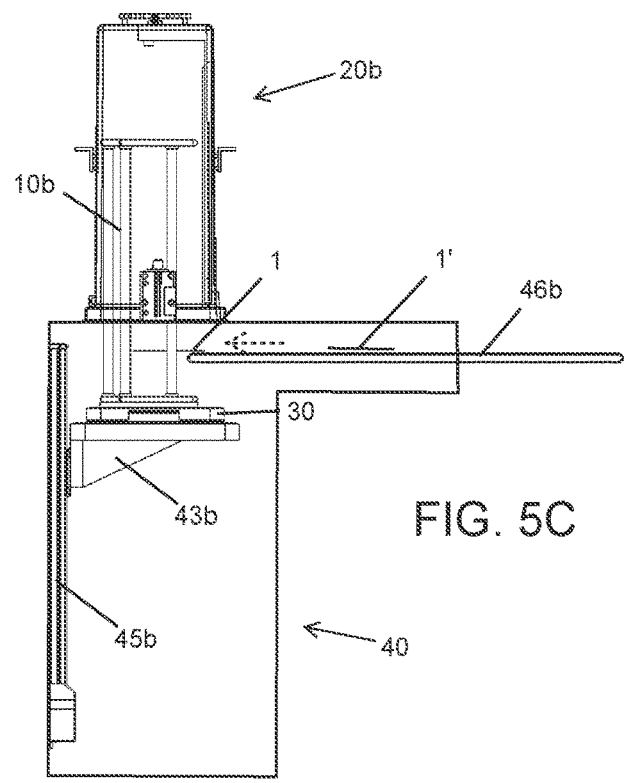
Figure 5D:
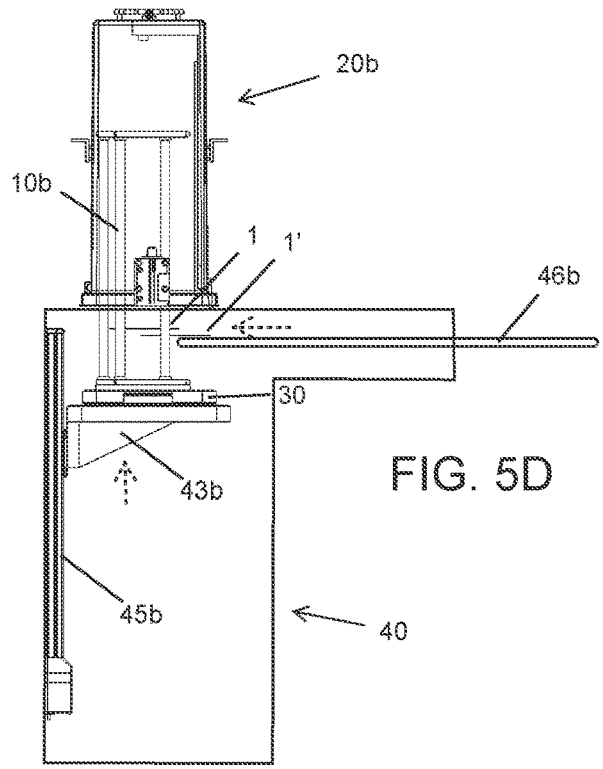

FIGS. 5A-5D show an example of such coordinated movement used in loading outgoing solar cells. In FIG. 5A, solar cell carrying pod 20*b* includes an empty cassette 10 for loading of outgoing solar cells has been sealed over the outgoing port 42*b* of tank receptacle 40. Pod base 30 has been coupled to elevator platform 43*b*, detached from cover 21 and withdrawn so that cassette 10 is partly within the interior of tank receptacle 40. Solar cells are positioned along a number of different shelves defined by support features in the rods of the cassette 10. Typically, cassette 10 is lowered until the top surface of the conveyor is at about the level of the top-most shelf of the cassette 10 at which an outgoing solar cell can be loaded in order to allow cassette 10 to be complete filled. It is appreciated however, that cassette 10 could be lowered to various positions in order to access various differing levels or shelves or to only partly fill the cassette 10 if desired. Once cassette 10 is lowered into a suitable position for loading of outgoing solar cells therein, as shown in FIG. 5A, the outgoing conveyor 46*b* is translated laterally towards cassette 10. Conveyor 46*b* can be translated to a position near the edge of the front opening defined by the rods of the cassette 10, as shown in FIG. 5B, or until the distal edge of the conveyor is within an interior space of the cassette 10. Once positioned as desired, outgoing solar cells are conveyed along outgoing conveyor 46b until the distal most solar cell 1 reaches its destination within a respective shelf of cassette 10, as shown in FIG. 5C. When loading solar cells, once a solar cell has been conveyed and slid into a storage shelf position defined between rods of cassette 10, elevator platform 43b raises cassette 10 upwards so that a subsequent solar cell 1' on the conveyor can be slid into the next lower shelf position in cassette 10, as shown in FIG. 5D. This sequence of coordinated movement can be repeated until the cassette is filled with solar cells.

The process of unloading a filled cassette 10 from solar cell carrying pod 20a filled with incoming solar cells may be accomplished by merely performing the above described steps in reverse, that is unloading from the bottom up. In such a process, a solar cell within cassette 10 of pod 20a is engaged by incoming conveyor 46a until the solar cell is slid out of its position in cassette 10. The solar cell is then conveyed on the incoming conveyor towards the fabrication line in the process flow tube. The elevator platform 43a then moves downward until a bottom of the solar cell in the next upwardly adjacent shelf position is lowered to a level of the incoming conveyer. This solar cell is then removed and transferred into the process flow tube via the conveyor. This approach of utilizing coordinated movement of conveyors and elevator platforms is advantageous as it allows for loading and unloading of the solar cell components along a common plane, which may be the same as the plane along which solar cells are transported within the fabrication line. Such a transfer system can be incorporated into an assembly-line type process flow so that the solar cells can remain at about the same elevation when not stored within the cassette of a respective solar cell carrying pod.

In another aspect, transfer of solar cell carrying pods 20 between staging racks 80 and the incoming and outgoing ports of tank receptacle can be performed automatically by a robotic arm 70, as shown in FIG. 1A. This allows the above described process of unloading and loading to be performed repeatedly using a large number of solar cell carrying pods.

In an aspect, to allow for transport of a respective pod by robotic arm 70, each solar cell carrying pod 20 includes a top handle 22 adapted for use with a gripper assembly 60 on a distal end of robotic arm 71, such as shown in FIG. 6A. Gripper 60 is adapted to releasably couple with top handle 22 of a respective solar cell carrying pod 20 for transport from staging racks 80 to receptacle 40, or vice versa. Robotic arm can also include a nozzle assembly 50 for charging a sealed pod 20 as needed. FIGS. 6B-6C show an example gripper assembly 60 defined by a pair of movable grasping jaws 61 extending from a common base 62 attached to the robotic arm 71. Top handle 22 is defined by a plate securely coupled to and spaced away from the top surface of the pod cover to allow the handle 22 to be grasped by a pair of movable grasping jaws 61 of gripper 60. Grasping jaws 61 are moveable between an open position for receiving top handle and a closed position for grasping top handle between gripper jaws 61. Movement of grasping jaws 61 between open and closed positions is effected by an actuation mechanism in an aspect. In this embodiment, the gripper actuation mechanism includes sleeve 64 that is movable distally so as to force gripper jaws 61 towards one another after top handle 22 is positioned therebetween, as shown in FIG. 7B. Distal movement of sleeve 64 can be air-actuation by a pneumatic mechanism. While an air-actuated gripper actuation mechanism is described here, it is appreciated that the gripper may utilize any suitable mechanism for effecting movement of a gripper jaws between an open and closed position, for example, a cable driven or lead screw driven mechanism, or an actuatable magnet. In one such example, an electro-magnet may be positioned to close gripper jaws 61 by magnetic force when activated, such that gripper jaws can be readily moved between open and closed positions by selective activation of the magnet.

In another aspect, a nozzle assembly 50 is provided to allow for automated charging of a solar cell carrying pod with inert gas, such as Nitrogen. In this embodiment, nozzle assembly 50 is incorporated into gripper assembly 60 so that solar cell carrying pod 20 can be charged with nozzle assembly 50 while being transported with gripper assembly 60.

Figure 7A:
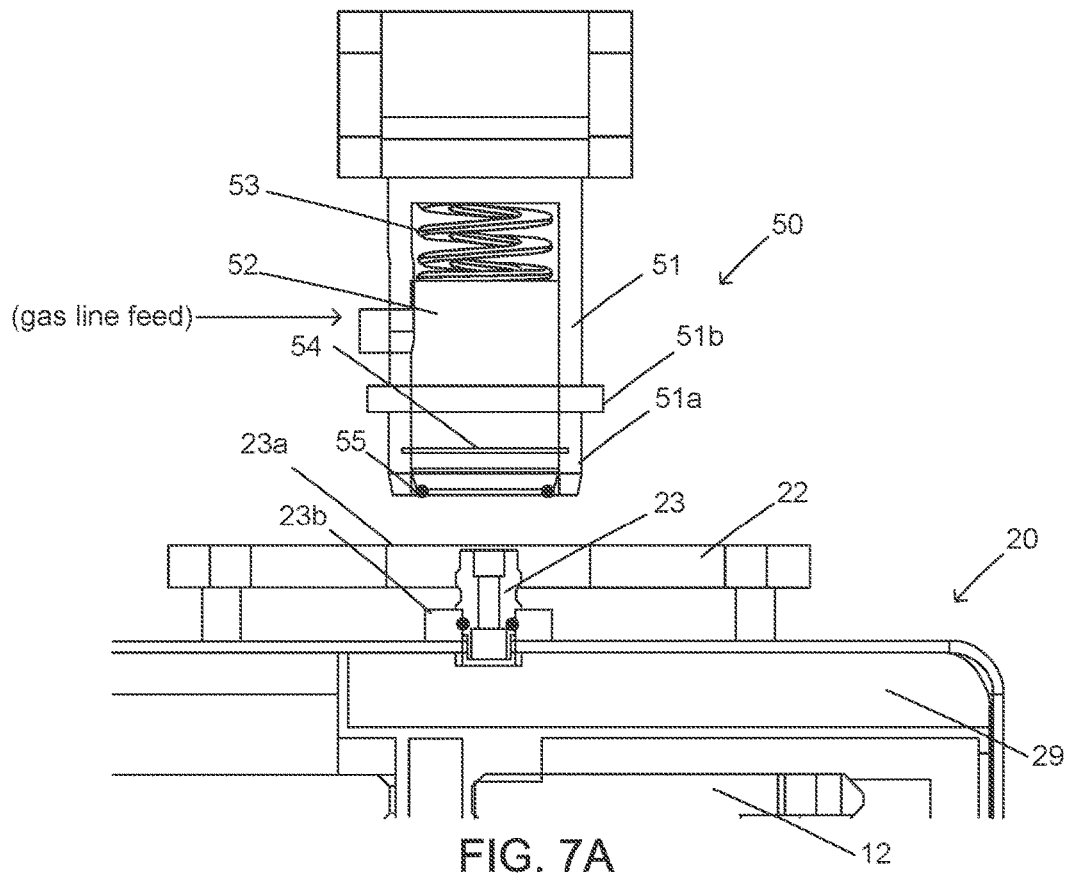
FIGS. 7A-7B illustrate a detailed view of a gripper and nozzle device of the robotic arm before and after attachment to the top handle and pressure valve of the solar cell carrying pod, respectively, in accordance with various embodiments.
Figure 7B:
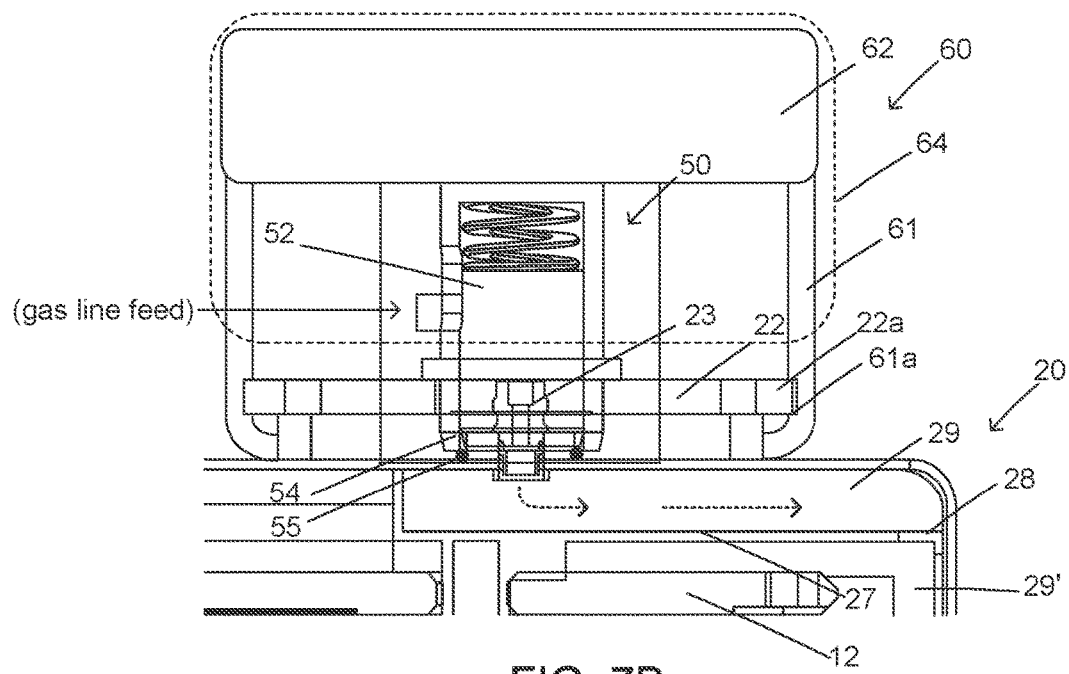

FIGS. 7A and 7B show an example in which nozzle assembly 50 is positioned over valve 23 and interface with valve 23 during gripping of top handle 22 with gripper assembly 60. Nozzle assembly includes nozzle housing 51, nozzle 52, nozzle biasing member 53, a retention ring 54 and an O-ring seal 55, as shown in FIG. 7A. As gripper assembly 60 is positioned over top handle 22, nozzle housing 51 extends through a center hole 23a in the plate of top handle 22 until boss 51b abuts against the top surface of top handle 22. Nozzle housing 51 includes a tapered distal portion 51a to assist in directing nozzle housing through center hole 23a. Nozzle 52 slides over valve boss 23b and O-ring 55 forms a seal about valve boss 23b to seal the interior flow path of nozzle 52 with the opening of valve 23, as shown in FIG. 7B. Nozzle biasing member 53, typically a spring, ensures there is sufficient force between nozzle 52 and valve 23 to support a positive pressure of inert gas sufficient to charge the environment of the solar cell carrying pod.

As can be seen in FIG. 7B, the inert gas flows through valve 23 into upper plenum 29. Upper plenum 29 is defined between an upper plate of align mount 27 and the top inside surface of cover 21. Because air flow of inert gas through valve 23 can be considerable, particularly at higher pressures, upper plenum 29 allows the inert gas to accumulate and avoids damage that might occur if the inert gas were blown directly onto the solar cells carried in the cassette below. The flow of inert gas is then directed through channels 28 and into the lower elongate plenum 29', which extends alongside cassette 10, as shown in FIGS. 11C and 12C. Lower elongate plenum 29' is defined between plenum diffuser 25 and the lower vertically extending portion of align mount 27. This lower elongate plenum 29' allows the inert gas to accumulate before flowing through the array of openings 25a in plenum diffuser 25 for controlled distribution over the stack of solar cells within pod 20. This further avoids damage to the solar cells carried within pod 20.

Figure 8D:
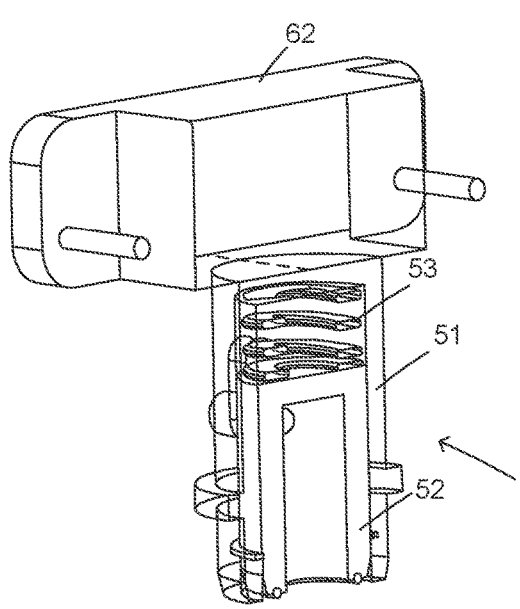
Figure 8E:
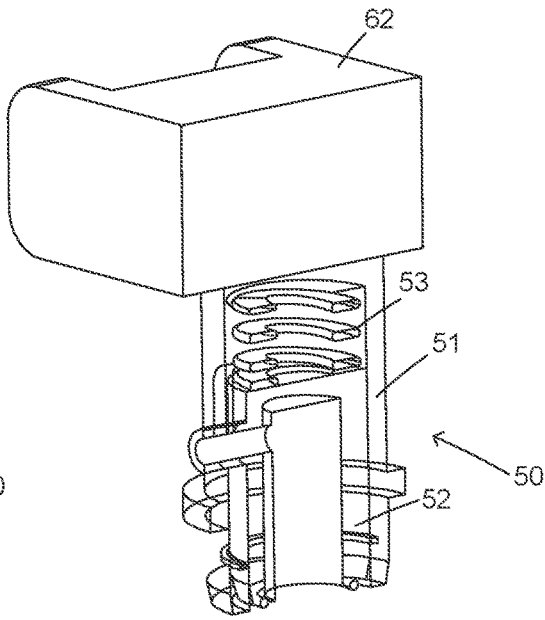

The various components of the nozzle assembly in relation to the gripper base 62 and gripper jaws 61 can be further understood by referring to the additional detailed views shown in FIGS. 8A-8E. FIG. 8A shows nozzle assembly 50 within gripper assembly 60 (shown without sleeve) with gripper arms 61 biased laterally outward. FIG. 8B shows a view of nozzle assembly 50 with nozzle housing 51 shown transparent for improved visibility of internal components. FIG. 8C shows an exploded view of nozzle assembly 50 and gripper assembly 60 (without sleeve). FIGS. 8D and 8E show cross-sectional views of nozzle assembly 50.

Figure 9A:
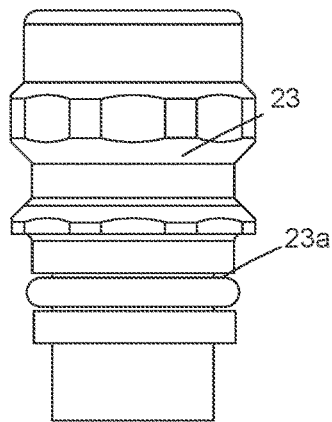
FIGS. 9A-9B illustrate various views of a valve of the solar cell carrying pod in accordance with various embodiments.
Figure 9B:
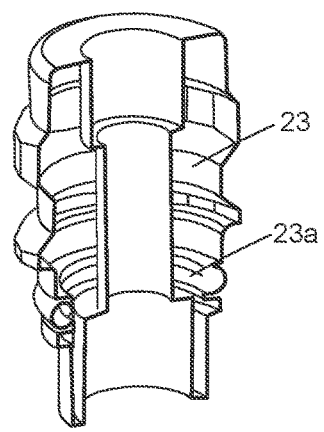

In various embodiments, nozzle assembly 50 can include a sensor adjacent biasing member 53 for determining when valve 52 is properly seated on valve boss 23b with sufficient sealing pressure before activated pressure controlled gas flow through the nozzle, typically by opening a valve within the gas feed line upstream of the nozzle. In this embodiment, valve 23 is a Schrader type valve as depicted in FIGS. 9A-9B (shown without pin). It is appreciated that other types of valve can be used in a solar cell carrying pod in various other embodiments.

Nozzle 52 includes an inlet stub 52a that extends from a side of nozzle and through slot 51a which allows for movement of the inlet stub during back-and-forth movement of nozzle 52 during coupling with valve 23. Inlet stub 52a is coupled with a gas feed line supplying the inert gas. This feed line can be attached to robotic arm 70 so as to not to interfere with movement of the robotic arm. While this embodiment includes the inlet stub 52a on the side of nozzle, it is appreciated that the inlet of nozzle 52 could be included in various other locations, including in the center of the top of the nozzle, which would avoid the need for slot 51a. Including inlet stub on the side, however, is useful as this allows more clearance for various other components above the nozzle, such as components associated with the integrated gripper.

Figure 10A:
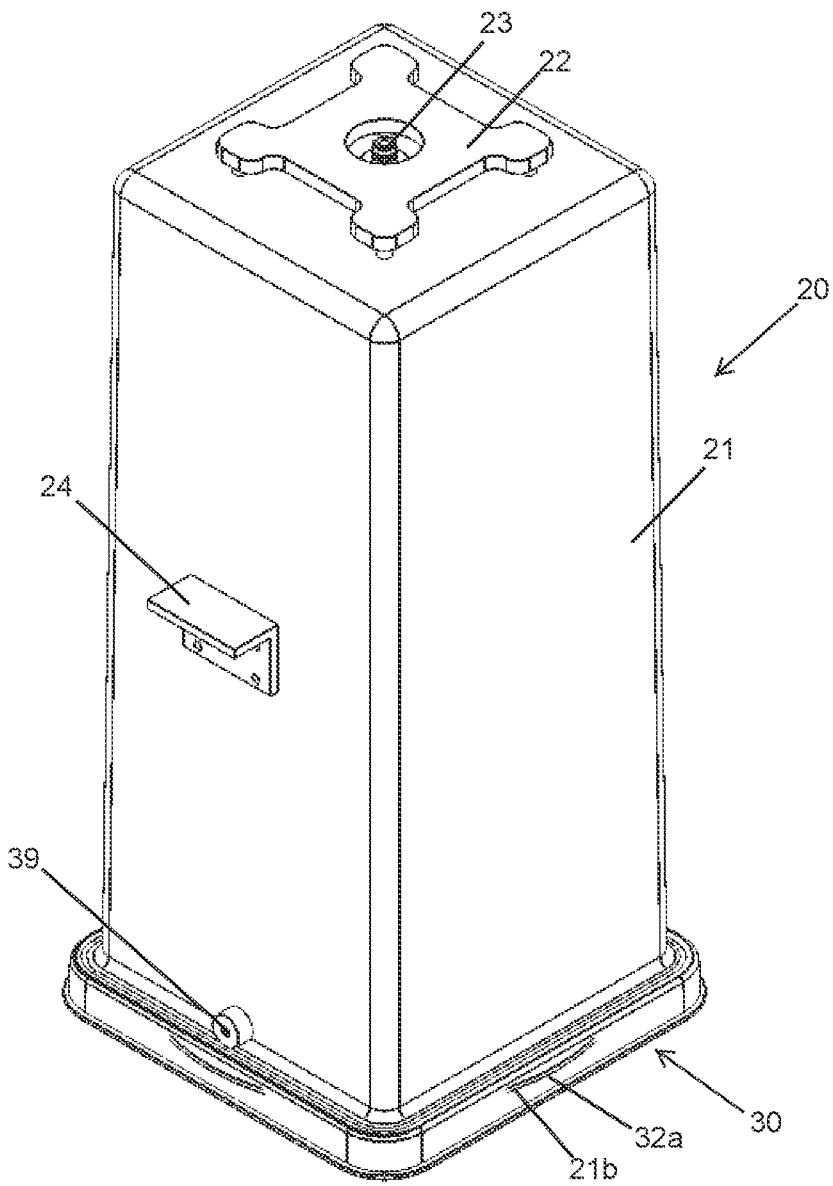
FIGS. 10A-10E illustrate various views of a solar cell carrying pod adapted to provide a microenvironment during transport and storage of solar cells carried within in accordance with various embodiments.

The above described configuration of nozzle assembly 50 is advantageous as it allows valve 23 to be sealingly coupled with the gas feed line for charging of the solar cell carrying pod, without requiring the higher tolerances that would be required if the nozzle were required to seal at the distal opening of the valve having a substantially smaller diameter. In addition, sealing the immediate environment about valve 23 by sealing the valve boss 23b with O-ring 55 allows a higher flow rate of gas such that an empty solar cell carrying pod can be charged with inert gas relatively quickly, for example, within a few seconds (e.g. less than 5 seconds, about 3 seconds or less). Once valve 23 is sealingly coupled with nozzle 52 and is pressurized, the inert gas flows into the sealed solar cell carrying pod. A secondary valve 39 may be included to allow purging of any ambient air within the empty solar cell carrying pod or to allow bleeding of excess pressure within pod 20 and that allows regular air to be blown out of the pod during charging. Typically, such a valve may be included at the bottom of the pod, as shown in FIG. 10A, because air flow is being introduced through valve 23 at the top of the pod. The inert gas can be provided during charged at a positive pressure, for example up to about 5 psi, typically at about 1 psi. In the alternative, a partial vacuum can be drawn through valve 23 or secondary valve 39 before introduction of inert gas through valve 23.

In another aspect, each of grasping jaws 61 and top handle 22 can include corresponding features to facilitate interfacing between the components. In this embodiment, grasping jaws 61 include an interfacing feature 61a that interfaces with an edge of top plate 22 within a recessed grasping region 22a dimensioned to correspond to the width of grasping jaw 61. Interfacing feature 61a can be defined by a groove or recess, such as shown in FIG. 6B-6C, or can be defined as an extended portion that extends inward so as to engage an underside of the plate of top handle 22, such as shown in FIG. 7B. These features allow each solar cell carrying pod 20 to reliably couple with gripper arms 61 of a respective gripper assembly 60 of robotic arm 71 in a controlled and predictable position and/or orientation. Such a configuration facilitates controlled positioning of each respective solar cell carrying pod on a desired port of the receptacle tank 40.

In this embodiment, the nozzle and gripper are integrated such that engagement of gripper jaws 61 with the top handle 22 to facilitate transport of the solar cell carrying pod also substantially aligns nozzle 52 with valve 23 of solar cell carrying pod 20. One or more additional features, such as a cut-out at the center of top plate 22, can also be used to further facilitate alignment of nozzle 52 and valve 23. In this embodiment depicts a gripper integrated with a nozzle assembly such that robotic arm 70 can effect controlled flow of gas into the solar cell carrying pod simultaneously or concurrently with grasping of the top handle with gripper 60. It is appreciated that the gripper and nozzle may be separate and/or controlled independent from one another. For example, in some embodiments, the nozzle may not be needed when the solar cell carrying pod has already been charged with inert gas previously. Thus, in such applications, a gripper without a nozzle may be used, or the nozzle may be de-activated or retracted so as not to engage the valve of the solar cell carrying pod.

Figure 10B:
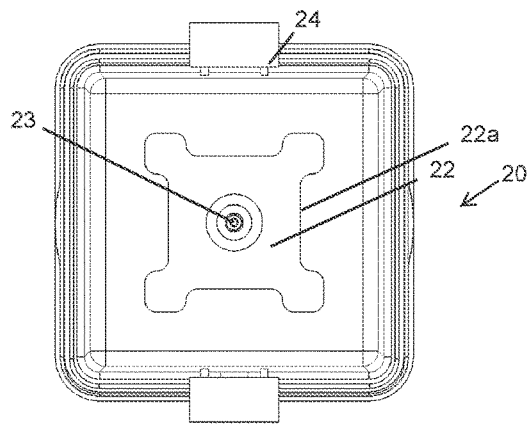
Figure 10D:
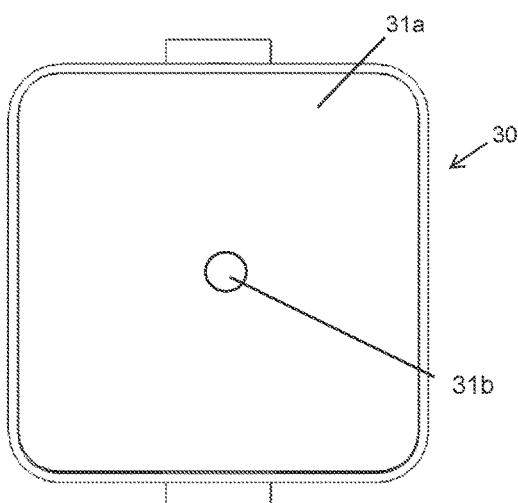
Figure 10C:
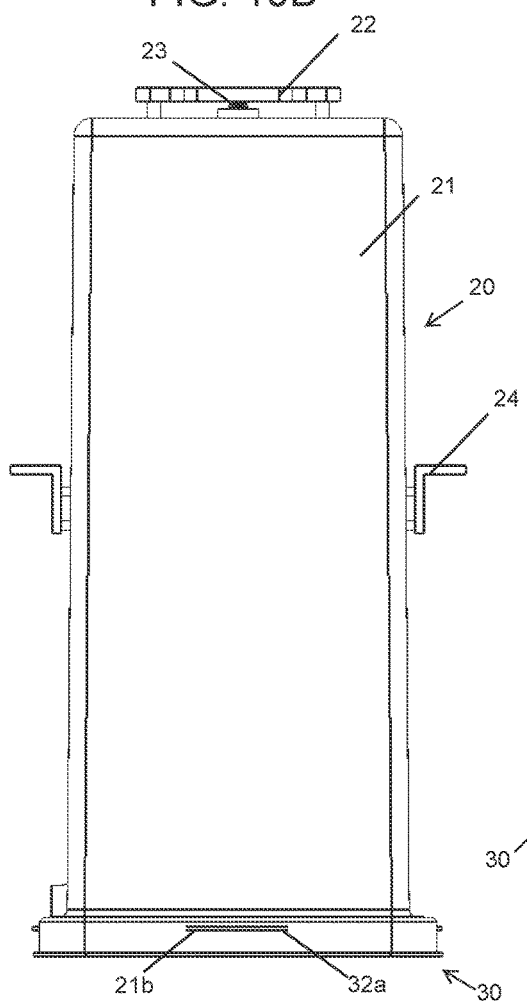

FIGS. 10A-10E show additional detailed views of solar cell carrying pod 20 adapted for use with the load lock solar cell transfer system described above. FIG. 10A shows a perspective view of example solar cell carrying pod 20 having a cover 21 sealingly coupled with base 30 via locking ring blades 32a engaged with locking slots 21b in the bottom portion of cover 21. As shown, cover 21 includes top handle 22 with valve 23 for controlling the micro-environment inside pod 20 and a secondary valve 39 for purging pod 20 or for bleeding off excess pressure during charging. Cover 21 can further include side handles 24 to facilitate handling of sealed pod 20 during transport or storage. FIG. 10B shows a top view of pod 20 with top handle 22 having recessed grasping regions 22a on each side and valve 23 accessed through a central hole in top handle 22 and FIG. 10C shows a side view of sealed pod 20 of FIG. 10A.

Figure 10E:
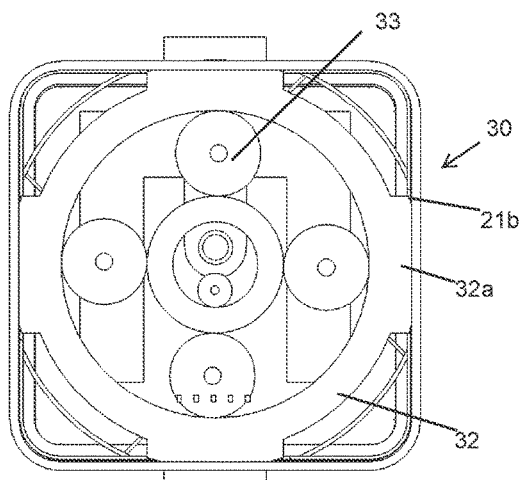

FIGS. 10D and 10E show a bottom view of sealed pod 20 of FIG. 10A with and without bottom cover 31a, respectively. Bottom cover 31a may fit over the bottom to protect the locking ring 32 and gear system 33 disposed in the underside that facilitates detachment and locking of the pod base 30 with the cover 21. The bottom cover 31a can include a central hole 31b to allow passage of a mechanism to operate the locking/unlocking of base 30 from cover 21. The mechanism can be a collet that extends through into base 30 through central hole 31b in bottom cover 21 such that bottom cover 31a can remain secured on base 30 during loading and unloading.

Figure 11A:
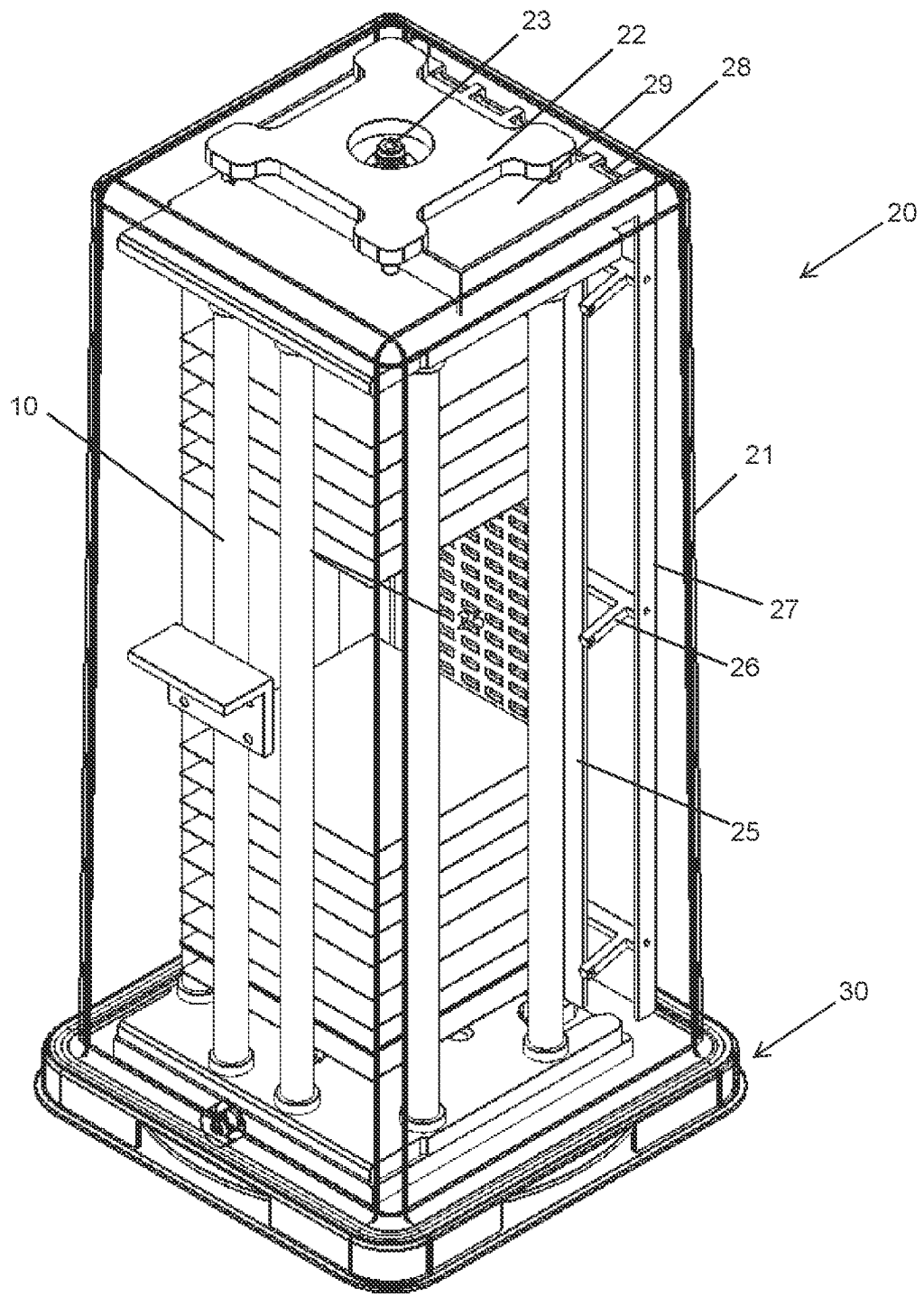
FIGS. 11A-11C illustrate various views of the solar cell carrying pod in FIG. 10A with the cover housing shown transparent.
Figures 11B, 11C:
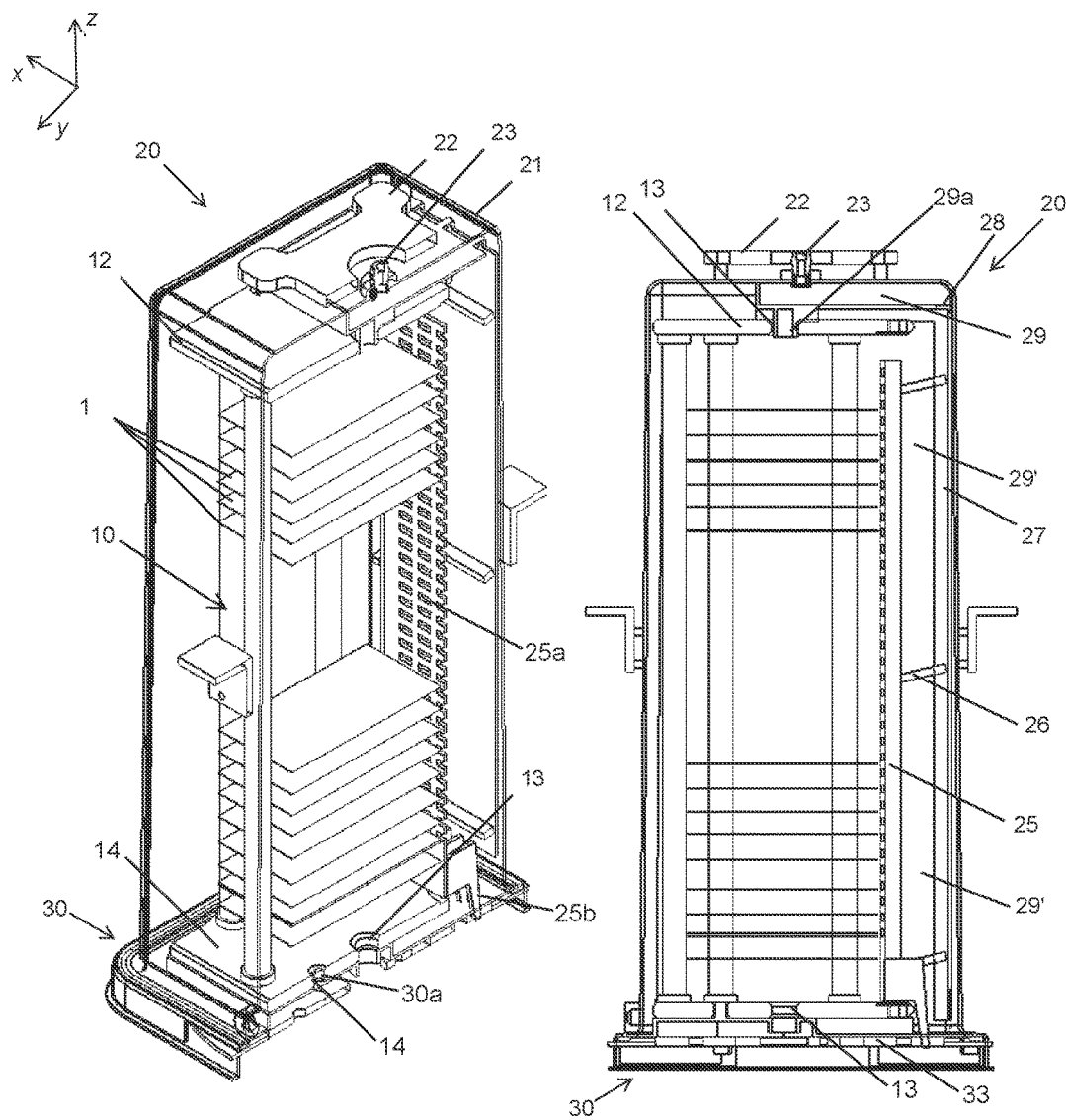

FIGS. 11A, 11B and 11C show pod 20 having solar cell carrier cassette 10 with a stack of solar cells sealed within pod 20 with cover 21 shown as transparent. FIG. 11A shows a perspective view; FIG. 11B shows a cross-sectional view; and FIG. 11C shows a side view. In this embodiment, pod 20 includes align mount 27 and plenum diffuser 25 attached within cover 21 that together define a plenum and flow path through which the inert gas flows when charging the cassette through valve 23. Align mount 27 is positioned along a rear side of cover 21 and forms upper plenum 29 directly under valve 23 in which flow of inert gas accumulates before traveling through channels 28 and into the lower plenum 29' defined between plenum diffuser 25 and align mount 27. Plenum diffuser includes an array of openings 25a along its major face to distribute air flow through the stack of solar cells 1 within cassette 10.

In various embodiments, coupling features 13 and alignment features 14 in end plates 12 of carrier cassette 10 are configured to interface with corresponding features inside solar cell carrier pod 20 to constrain movement of cassette 10 and secure cassette 10 within pod 20. For example, as can be seen in FIGS. 6B-6C, upper plenum can include a stub 29a that extends through coupling feature 13 in the adjacent end plate 12 of cassette 10. This interface constrains lateral movement of adjacent end plate 12 of cassette 10 within both the x-direction and y-direction, while still allowing movement in the z-direction when cassette 10 is withdrawn by retracting base 30 into tank receptacle 40. In end-plate 12 coupled to base 30, alignment feature 14 (e.g. three holes spaced apart by 120 degrees) can interface with corresponding protrusions or pegs 30a extending from base. These alignment features maintain the x-y orientation and prevent movement in the x-direction and y-direction. When base 30 is securely coupled to cover 21, movement of cassette 10 in the z-direction is prevented by engagement of respective end plates 12 with each of upper plenum 29 and base 30.

Figure 14:
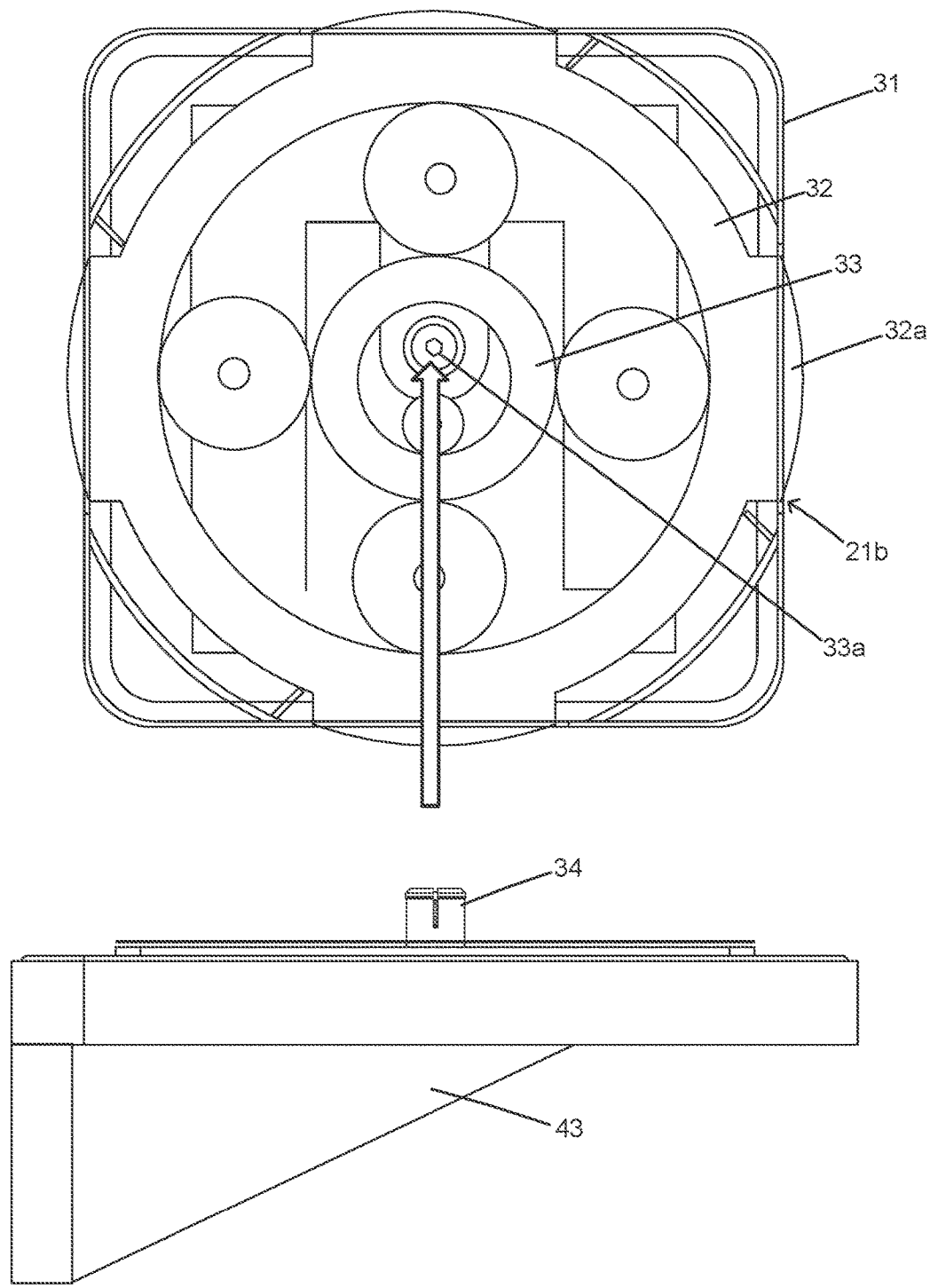
FIG. 14 illustrates a detail view of the gear system in an underside of the removable base of the solar cell carrying pod and an elevator platform of the tank receptacle having a motor-driven collet for operating the gear system of the solar cell carrying pod in accordance with various embodiments.
Figure 15A:
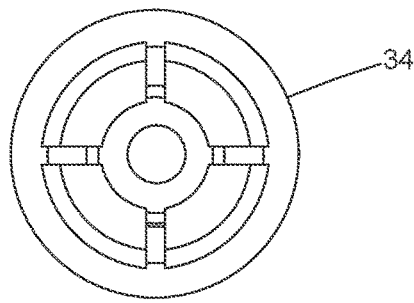
FIGS. 15A-15E illustrate detail views of the motor driven collet of the tank receptacle for operation of the gear system of the pod base in accordance with various embodiments.
Figure 15B:
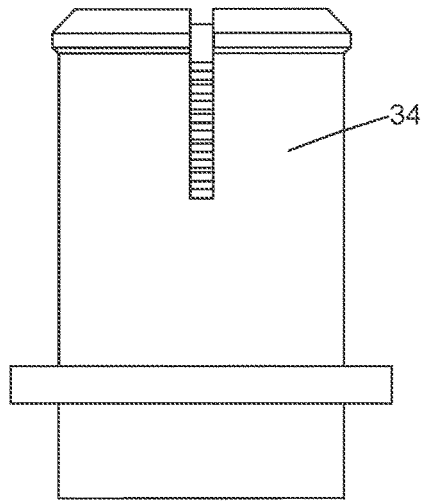
Figure 15D:
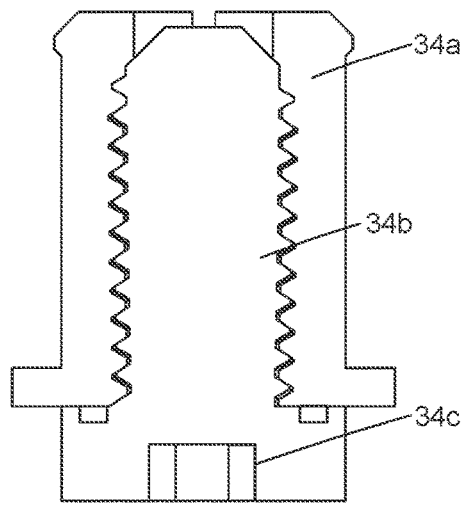
Figure 15C:
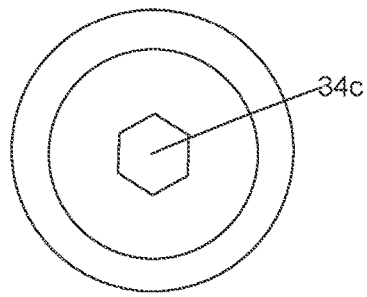
Figure 15E:
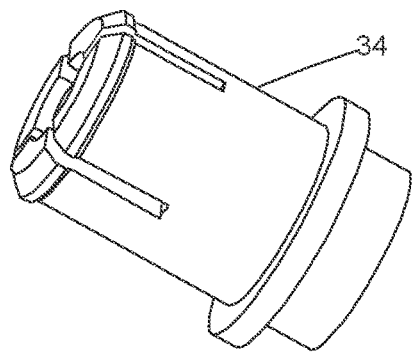

In various embodiments, end plates 12 of cassette 10 can be further secured to base 30 with respect to the z-direction through coupling feature 13 when base 30 is removed from cover 21 and withdrawn into tank receptacle. This can be accomplished by collet 34, an example of which is shown in FIG. 14, which is the same mechanism that effects unlocking and release of base 30 from cover 21, as described below with respect to FIG. 7C. Upon insertion into base 30, collet 34 extends through the gear drive system 33 and engages coupling feature 13 in end plate 12 in addition to collar 33a that drives the gear system 33. Since the distal-most portion of collet 34 expands to a greater diameter than a more proximal portion, cassette 10 is secured in the z-direction while collet 34 freely rotates in circular coupling feature 13 while engaged with gear system 33 so that cassette 10 is secured to base 30 in each of the x, y and z-directions while base 30 is retracted on elevator 43 into tank receptacle 44. This ensures precise positioning of solar cells carried within cassette 10 to facilitate automated loading and/or unloading of solar cells from cassette 10. While these end plates 12 and gear system 33 are configured for engagement with collet 34, it is appreciated that various other actuator, releasably fasteners, or engagement mechanisms could be used.

In various embodiments, pod 20 is charged with an inert gas provided through valve 23 at a positive pressure. Inert gas can be introduced through valve 23 after drawing a partial vacuum in the pod or can be introduced while allowing discharge of any air within the pod through a secondary valve. Inert gas can be provided through valve 23 at low pressures or relatively high pressures that allow for rapid charging, for example within 5 seconds or less. In various embodiments, inert gas can be introduced through valve 23 at a pressure within a range of 0-5 psi, typically about 1 psi. While relatively high pressures facilitate rapid charging of solar cell carrying pod 20, such pressures produce relatively high flow rates that can potentially damage the delicate solar cell components stacked within the cassette, particularly if the gas flow is directed directly onto the upper-most wafer. To avoid this problem, upper plenum 29 allows gas to accumulate before the gas flow is directed through channels and into an elongate narrowed lower plenum 29' along the backside of the cover for controlled distributed flow across the stack of solar cells through plenum diffuser 25.

Figures 12A, 12B:
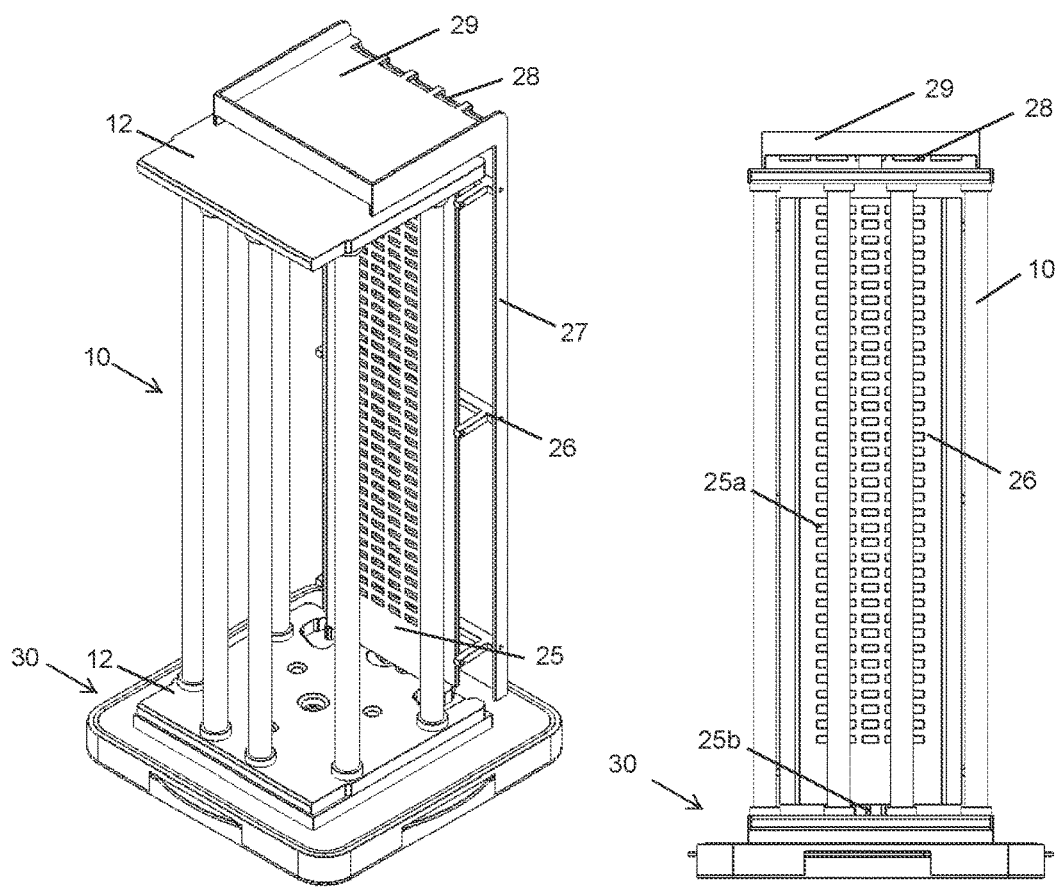
FIGS. 12A-12C illustrate various views of the align mount and plenum relative the cassette of FIG. 10A shown without the pod cover to better show internal components.
Figure 12C:
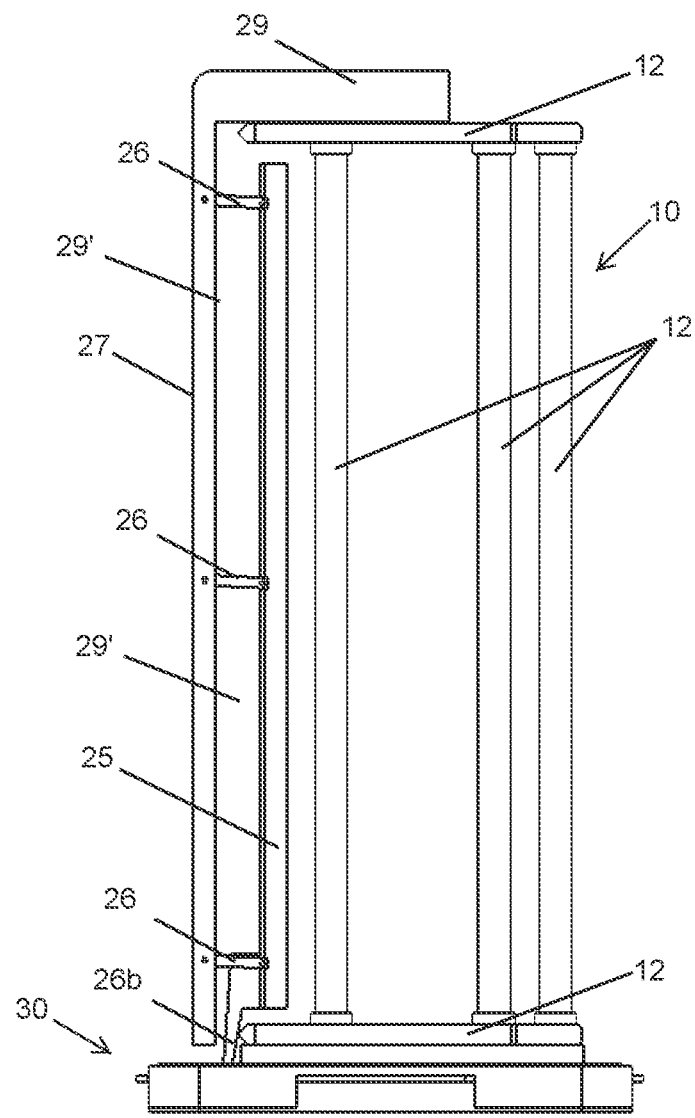

In another aspect, plenum diffuser 25 functions as a spacer to secure solar cells within carrier cassette 10 during storage. Plenum diffuser 25 is configured to move towards solar cells within cassette 10 when base 30 is sealingly coupled to cover 21 so as to occupy any additional space at the front of cassette 10 where solar cells 1 were loaded. Typically, plenum diffuser is configured to move towards the stack of solar cells to position plenum diffuser 25 in close proximity (e.g. about 1 mm or less) to the stack of solar cells without actually contacting the solar cells. By occupying this space, plenum diffuser 25 prevents any undesired movement of the stack of solar cells that may inadvertently damage one or more solar cells. The above described movement of plenum diffuser 25 is provided by pivoting hinges 26 that couple plenum diffuser 25 to align mount 27. This pivoting movement is effected by engagement of bottom pins 25b extending downwards from plenum diffuser 25 towards pod base 30. Pins 25b contact base 30 when positioned onto cover 21 causing plenum diffuser 25 to swing upwards and towards the stack of solar cells within carrier cassette 10. Additional detailed views of these components are shown in FIGS. 12A-12C, which show perspective, front and side views, respectively, of carrier cassette 10 mounted to base 30 (shown without cover for improved visibility of internal components).

Figure 13A:
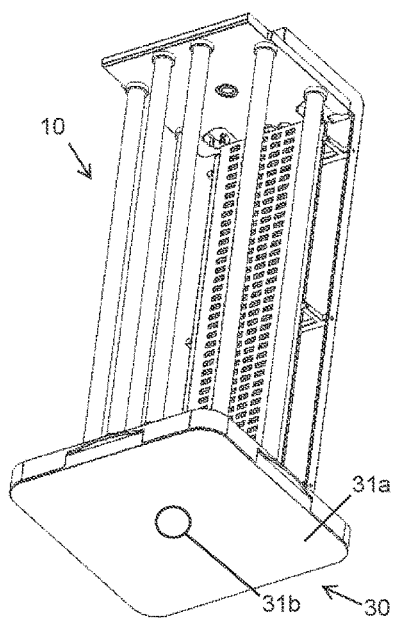
FIGS. 13A-13B illustrate a bottom view and an exploded bottom view, respectively, of a gear system in a pod base for effecting locking and release of the removable base with the cover of the solar cell carrying pod in accordance with various embodiments.
Figure 13B:
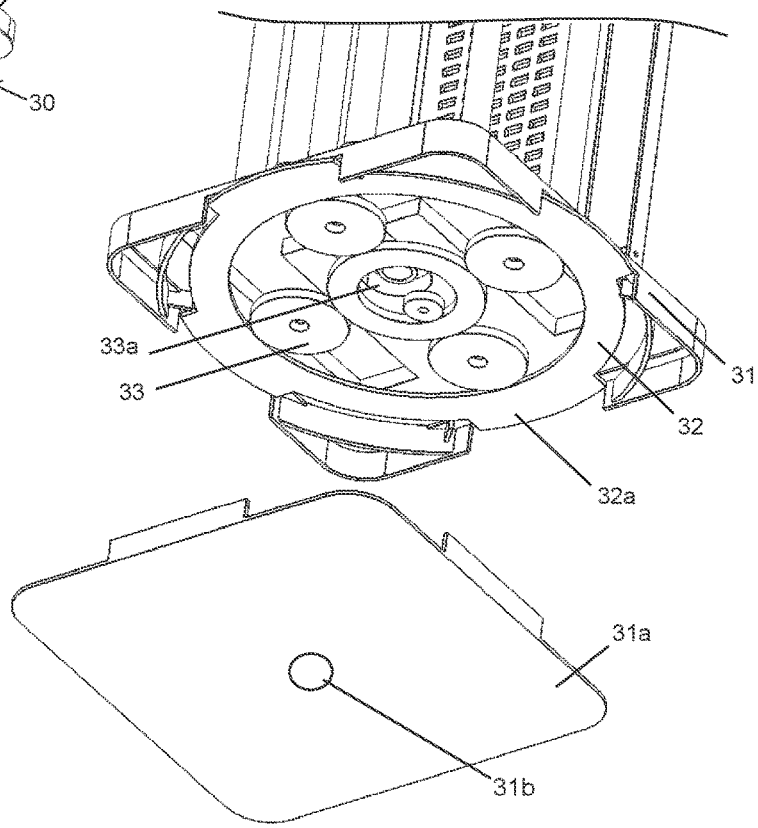

FIGS. 13A and 13B show bottom views of base 30 coupled with carrier cassette 10 with and without bottom cover 31a. As can be seen in FIG. 13B, gear drive system 33 is disposed within base housing 31, such that gear drive system 33 is operable by a mechanism provided on an underside of pod 20 that drives gear drive system 33 by rotating central collar 33a to rotate locking ring 32 and rotate locking blades 32a away from the locked position.

FIG. 14 illustrates the actuation mechanisms that effects operation of gear drive system 33 in base 30 to effects unlocking and/or locking of pod base 30 from pod cover to facilitate removal and retraction of base 30 for loading or unloading of solar cells. In this embodiment, actuation mechanism comprises collet 34 disposed within elevator platform 43 on which pod base 30 is positioned. Collet 34 extends upwards so as to be received within a corresponding collar 33a within gear system 33 of pod base 30. Motor-driven expansion and rotation of collet 34 circumferentially engages collar 33a and drives the gear system 33 to rotate locking ring 32 between the locked and unlocked positions. Rotating collet 34 in one direction facilitates unlocking of pod base 30 from pod cover 21 while rotating collet 34 in the other direction facilitates locking of pod base 30 to pod cover. While in this embodiment the actuation mechanism is a collet, it is appreciated that various other engagement mechanisms can be used to effect unlocking and locking of the base from the pod cover.

Figure 16A:
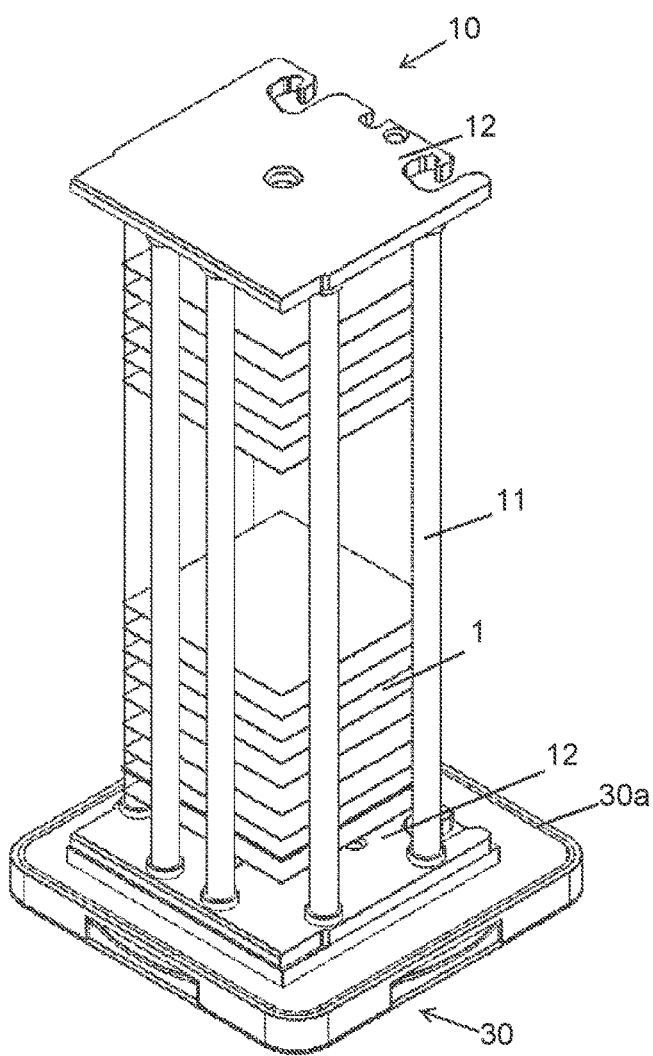
FIGS. 16A-16B illustrate a solar cell carrying cassette attached to a base for use in a solar cell carrying pod in accordance with various embodiments.

As shown in FIG. 14, locking ring 32 includes locking blades 32a that extend outside of pod base housing 31 and into locking slots 21b along the bottom of the pod cover 21 when locking ring 32 is rotated to the locked position. When positioned as such while pod cover 21 is disposed atop cover 30, locking blades 32a engage a corresponding surface along bottom ridge 21a of pod cover 21 to couple base 30 with pod cover 21 with sufficient force to seal base 30 and pod cover 21 together. Typically, as shown in FIG. 16A, lip seal 30a circumscribes the top surface of pod base 30 for engaging a bottom facing surface of pod cover 21. When sealed, lip seal 30a maintains the sealed environment within the pod for an extended period of time typically about 60 days or more. When collet 34 is rotated to unlock base 30 from cover 21, gear system 33 effects rotation of locking ring 32 so that locking blades 32a are rotated and stored within pod base housing 31 in each rounded corner of base 30. In this position, locking ring 32 is no longer engaged with the bottom ridge of pod cover 21 such that pod base 30 is detached. Elevator base 34 can then be lowered with detached base 30 along with attached cassette 10 to facilitate unloading or loading of cassette 10 with solar cells such as described above and shown for example in FIGS. 5A-5D.

FIGS. 15A-15E illustrate various views of collet 34 in accordance with the example shown in FIG. 14. Collet includes a spreadable collar 34a, an internal threaded bolt 34b and a proximal head 34c by which collet 34 can be driven by a mechanism disposed within elevator base 43.

Rotation of threaded bolt 34 causes spreadable collar 34a to expand radially so as to securely engage a corresponding collar 33a within gear system 33 so that subsequent rotation of collet 34 drives gear system 33 to effect locking or unlocking of base 30 from cover 21 via rotation of locking ring 32.

Figure 16B:
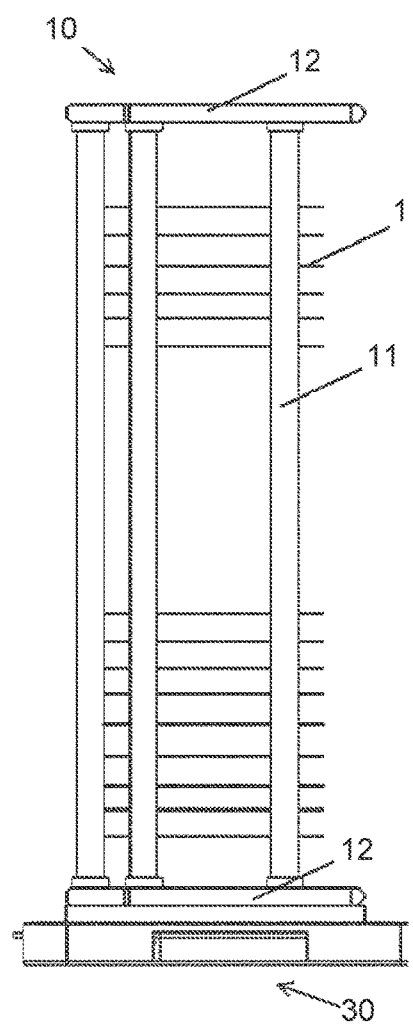
Figures 17A, 17B:
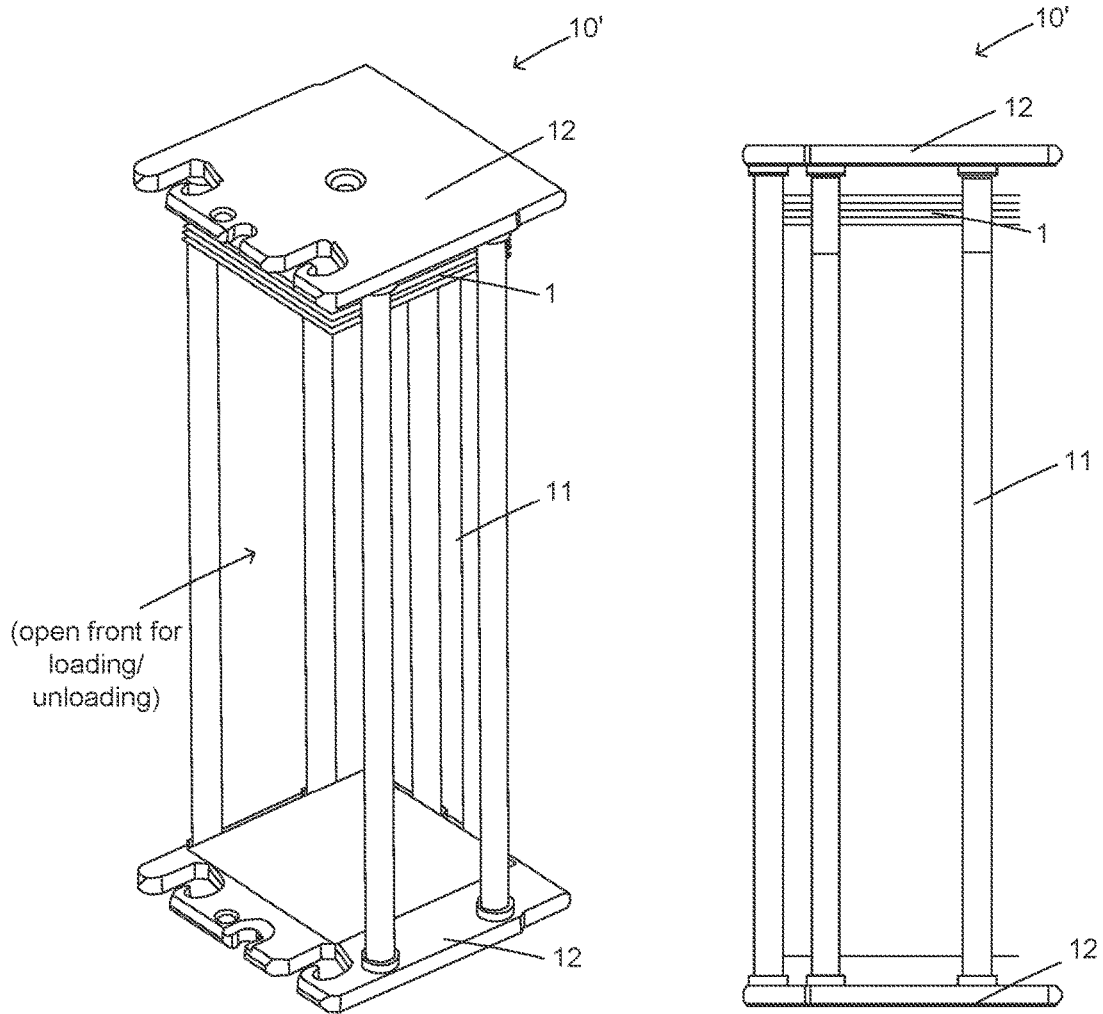
FIGS. 17A-17B and 18 illustrate another solar cell carrying cassette suitable for use in a solar cell carrying pod in accordance with various embodiments.
Figure 18:
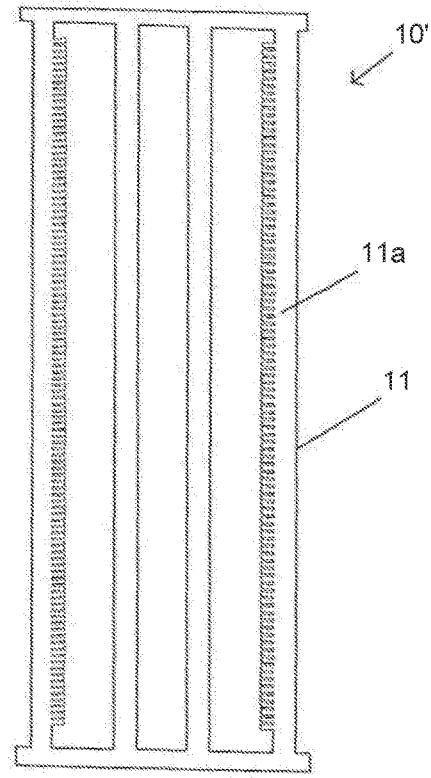

FIGS. 16A-16B, 17A-17B and 18 illustrate exemplary solar cell carrying cassettes 10 for use within solar cell carrying pods and transfer systems in accordance with various embodiments. Each cassette 10 typically includes a pair of end plates 12 spaced apart by sets of rods 11 that form a framework defining an interior space for supporting a stack of solar cells. Typically, cassette 10 includes three pairs of rods 11 extending between edges of three sides of end plates 12 so as to define a square shaped space for supporting the stack of solar cells while leaving a front side of the space open for loading and unloading of the solar cells from the stack. Rods 12 typically include support features 11 for supporting each of the solar cells within a stack, such that in combination, the pairs of rods define a number of spaced apart shelf positions along which solar cells can be inserted or withdrawn. It is appreciated that the support features 11 can be spaced apart to allow more space between each adjacent solar cell within the stack, as shown in FIGS. 16A-B, or can be closer to allow relatively little space between adjacent solar cell components within a stack, as shown in FIGS. 17A-B.

Figure 19A:
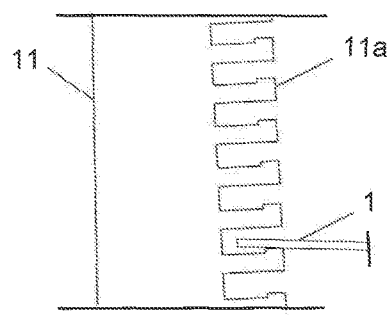
FIGS. 19A-19C illustrate solar cell carrying features defined in the rods of exemplary solar cell carrying cassettes for use in a solar cell carrying pod and transfer system in accordance with various embodiments.
Figure 19B:
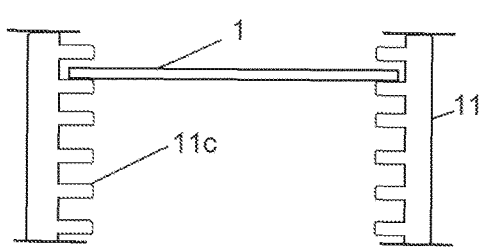
Figure 19C:
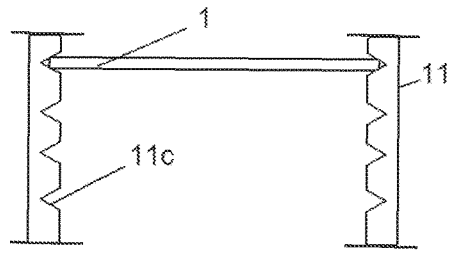

FIGS. 19A-19C illustrate example solar cell support features of rods 11 that can be used in example solar cell carrying cassettes. The support features can include any feature suitable for supporting a solar cell. For example, such support features can be defined as an L-shaped support 11a as shown in FIG. 19A, a shelf-like support 11b as shown in FIG. 19B, or a recess or notch 11c as shown in FIG. 19C. Different features may be desirable depending on the stage of fabrication of the solar cell component being supported. For example, in a relatively early stage of fabrication, when the solar cell component is relatively fragile and may include developer residue along the edges, the L-shaped support in 11a may be desirable as it avoids contacts and associated stresses being applied at the extreme edges of the solar cell component.

FIG. 20 illustrates an exemplary end plate 12 for use in an exemplary cassette. Each end plate 12 is formed of a material suitable for use in a cassette used for storing solar cells. Typically, end plates 12 and rods 11 are each formed of a metal, such as stainless steel, that provides sufficient strength for use in a cassette while being resistant to various chemicals used in the solar cell fabrication process. It is appreciated that these components may also be formed of polymers or combination of materials as desired. End plates 12 can include various interfacing features that interface with corresponding features of the solar cell carrying pod 20 to facilitate the various uses and functions described above. Such interfacing features can include coupling features, alignment features and handling features or combinations thereof, as described in further detailed in the examples below.

Figure 20A:
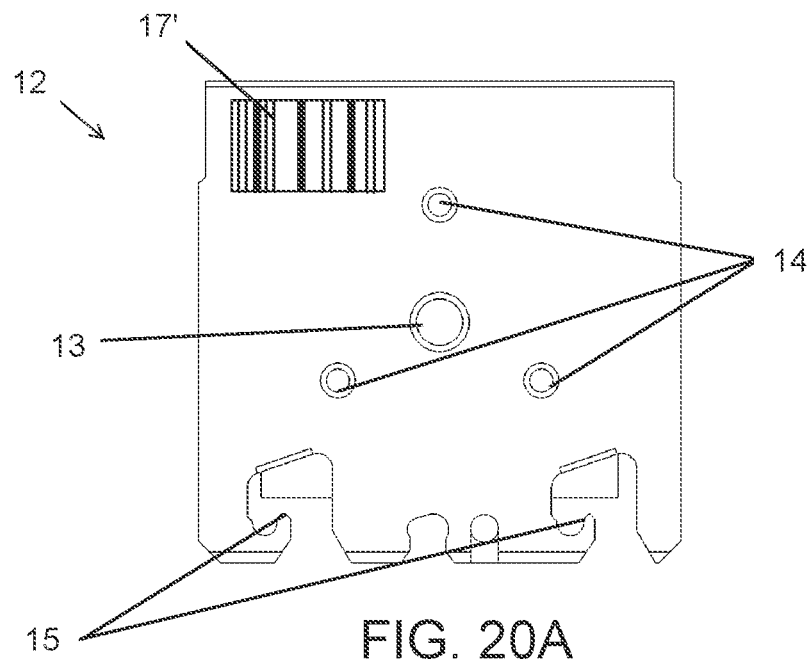
FIGS. 20A-20B illustrate example end plates of a solar cell carrying cassettes for use in a solar cell carrying pod and transfer system in accordance with various embodiments.
Figure 20B:
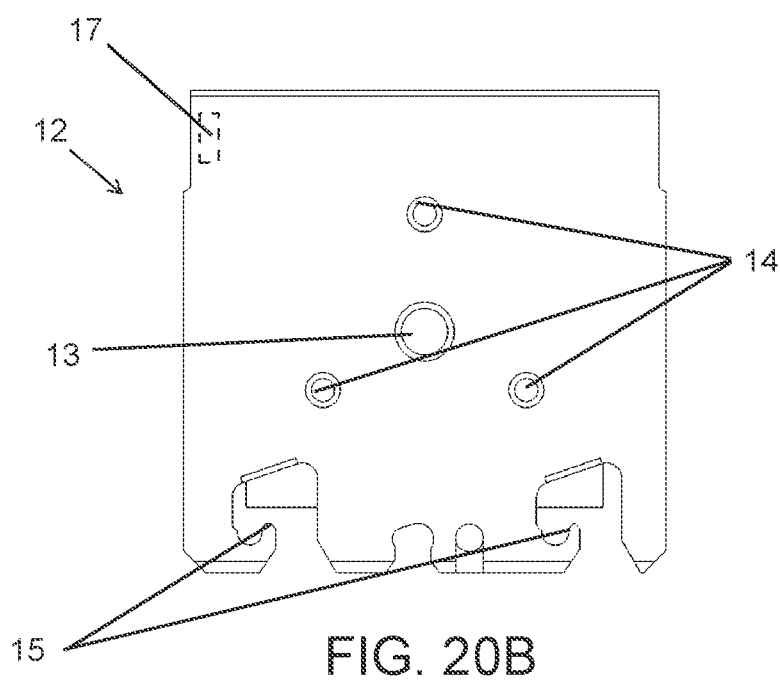

As shown in FIGS. 20A-20B, each end plate 12 includes one or more coupling features 13 that facilitate coupling of cassette 10 within solar cell carrying pod 10. Couplings features 13 may include one or more shaped openings, typically circular in shape, that interface with a corresponding features within the interior of solar cell carrying pod used to secure the cassette within solar cell carrying pod 20. In this embodiment, coupling feature 13 is a circular opening near a center of each end plate 20. Such a coupling feature 13 is used in each of the example carrier cassettes 10 shown in FIGS. 16A-16B, 17A-17B and 18.

Each end plate 12 can further include one or more alignment features 14 that faciliate orientation (e.g. rotational orientation relative a longitudinal axis of cassette) by interfacing with one or more corresponding features within solar cell carrying pod 20 (e.g. pins) or in a subsequent process. Alignment features 14 can be defined as multiple openings in a particular arrangement so as to ensure cassette 10 is secured in a particular orientation within pod 20. For example, in this embodiment, rods 10 are typically arranged in pairs and extend between end plates 12 on three sides, except a front edge of each end plate 12, leaving a front side of cassette 10 open for loading and unloading of solar cells from between rods 10. When alignment features 14, defined here as a group of three offset holes, that are interfaced with corresponding protrusions (e.g. pegs) in base 30 or upper plenum 29 inside solar cell carrying pod 20. Cassette 10 is oriented so that the fourth open side is oriented towards the conveyors when elevator 43 is lowered for loading or unloading of solar cells within cassette 10. In various embodiments, coupling features 13 and/or alignment features 14 are arranged in corresponding positions on each end plate 12 so that regardless of which end plate 12 is coupled to base 30 of solar cell carrying pod 20, cassette 10 operates in the same manner.

Each end plate 12 can further include handling features 15 to faciliate handling of cassettes 10 (e.g. lateral positioning, transport, suspension of cassettes for cleaning, or handling in various other processes). In this embodiment, handling features 15 are defined as hook-shape recesses along the front edge of each end plate 12. These features, unlike coupling feature 12, define a particular orientation, such as a left-sided or right-sided orientation, in which the handling features 15 both hook towards the same side of cassette 10. While the orientations of the handling features 15 may be useful in certain other processes, in various embodiments, cassette 10 can be attached to base 30 within solar cell carrying pod 20 in either orientation.

Each end plate can further include an identification feature or identifier 17 that can be used by system to identify a particular cassette 10 and associated solar cells, or may be used to confirm the presence of cassette 10 within pod. Identifier 17 can include a barcode, RFID chip, or any other suitable feature suitable for identification. In certain embodiments, an RFID chip is advantageous as it allows cassette 10 to be readily identified by the system even when sealed within pod 20 where other identification features may be obscured from view. It is appreciated that such features can be defined in various other location, shapes and numbers as desired for a particular function or application.

In various embodiments, cassette 10 can further include an identifier in each end plate 12, but unlike the various other features (e.g. coupling, alignment and handling features described above), identifier 17 in each end plate can be disposed on different sides of end plate on different ends of cassette 10.

Figure 21:
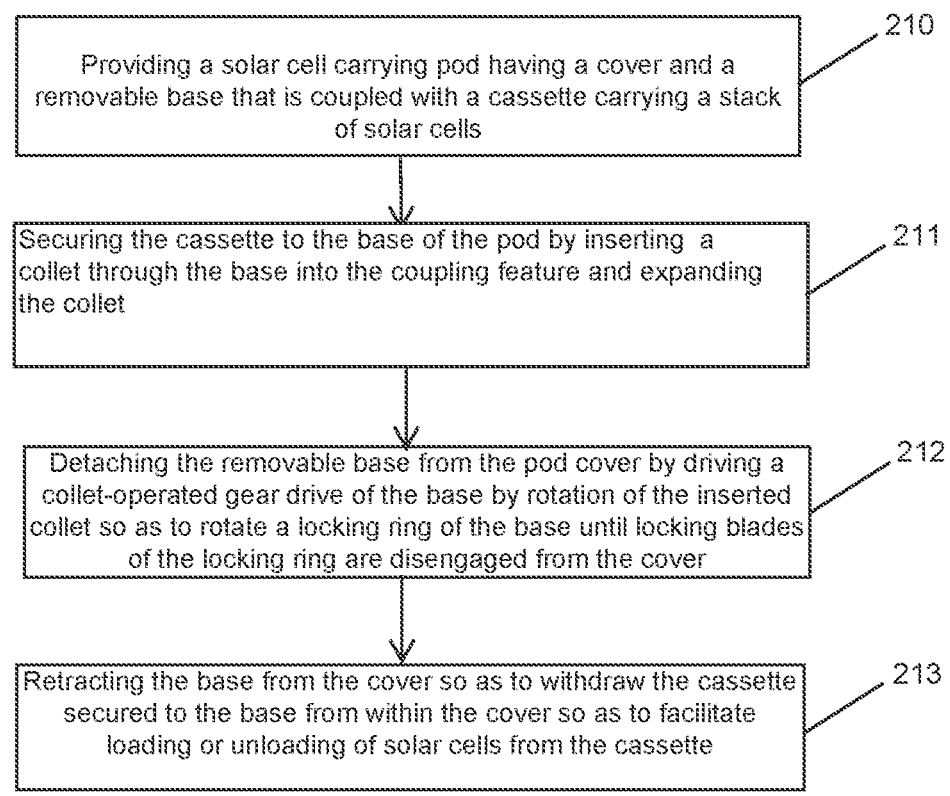
FIGS. 21-22 depict methods of using example solar cell carrying pods in accordance with various embodiments.
Figure 22:
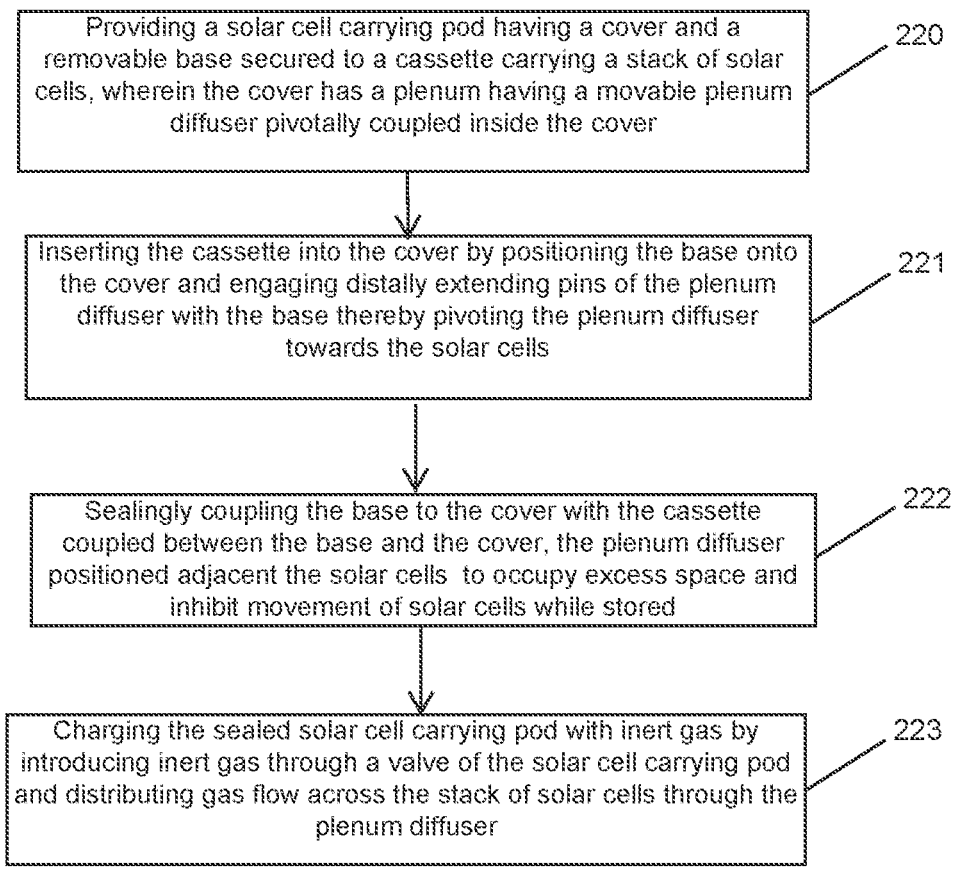

FIGS. 21-22 depict exemplary method of utilizing a solar cell carrying pod in accordance with various embodiments. FIG. 21 depicts one such method of using a solar cell carrying pod having a cover and a removable base that is coupled with a cassette carrying a stack of solar cells 210. Such a method can include securing the cassette to the base of the pod by inserting a collet through the base into the coupling feature and expanding the collet 211. The removable base can be detached from the pod cover by driving a collet-operated gear drive of the base by rotation of the inserted collet so as to rotate a locking ring of the base until locking blades of the locking ring are disengaged from the cover 212. Next, the base can be retracted from the cover so as to withdraw the cassette secured to the base from within the cover so as to facilitate loading or unloading of solar cells from the cassette 213.

FIG. 22 depicts a method of using a solar cell carrying pod having a cover and a removable base secured to a cassette carrying a stack of solar cells. The cover includes a plenum having a movable plenum diffuser pivotally coupled inside the cover 220. The method can include inserting the cassette into the cover by positioning the base onto the cover and engaging distally extending pins of the plenum diffuser with the base thereby pivoting the plenum diffuser towards the solar cells 221. The base can be sealing coupled to the cover with the cassette coupled between the base and the cover so that the plenum diffuser is positioned adjacent the solar cells to occupy excess space and inhibit movement of solar cells while stored within the pod 222. The sealed solar cell carrying pod can then be charged with inert gas by introducing inert gas through a valve of the solar cell carrying pod and distributed across the stack of solar cells through the plenum diffuser 223.

The embodiments described should not limit the scope of the disclosure. Indeed, various modifications of the embodiments, in addition to those described herein, will be apparent to those of ordinary skill in the art from the foregoing description and accompanying drawings and claims. For example, multiple locking and unlocking mechanisms may be used other than those described herein. Additionally, differing configurations of the base, cover, and cassette of the carrying pods would be readily understood by those of skill in the art from the disclosure provided here. Thus, such modifications are intended to fall within the scope of this invention. Further, although some of the embodiments of the present invention have been described herein in the context of a particular implementation in a particular environment for a particular purpose, those of ordinary skill in the art will recognize that its usefulness is not limited thereto and that the embodiments of the present inventions can be beneficially implemented in any number of environments for any number of purposes. Accordingly, this disclosure should be construed in view of the full breath and spirit of the embodiments disclosed herein and claimed below.

What is claimed is:

1. A solar cell carrying pod comprising:
   a cover adapted to receive a carrier configured to support a plurality of solar cells;
   a base adapted to removably and sealably couple with the base with the carrier received within the cover,
   a locking mechanism for locking the base to the cover when sealably coupled thereto,
   wherein the cover and base are configured to sealably couple so as to maintain a scaled micro-environment of inert gas about the plurality of solar cells for a period of time, wherein the cover includes a valve for introduction of the inert gas and/or control of the micro-environment therein; and
   a plenum in fluid communication with the valve, wherein the plenum includes a plenum diffuser that extends along a substantial length of the carrier so as to distribute the inert gas among the plurality of solar cells contained within the carrier when the inert gas is introduced through the plenum, wherein the plenum diffuser is movable between a first and second position, the first position being spaced away from the solar cells within the carrier to facilitate receiving of the carrier within the cover and the second position being in close proximity to the plurality of solar cells within the carrier to constrain lateral movement of the solar cells within the carrier when the base and cover are sealingly coupled.

2. The solar cell carrying pod of claim 1, wherein the scaled micro-environment comprises an inert gas at a partial vacuum or a positive pressure, wherein the period of time comprises one week or more.

3. The solar cell carrying pod of claim 2, wherein the period of time comprises a least 60 days.

4. The solar cell carrying pod of claim 1, wherein the locking mechanism is incorporated into the base.

5. The solar cell carrying pod of claim 4, wherein the locking mechanism comprises a locking ring rotatable between a locked position and an unlocked position, wherein the locking ring comprise a plurality of locking blades that engage with a corresponding interface of the cover such that:
   when the locking ring is in the locked position, the base and cover are sealably coupled together, and,
   when the locking ring is in the unlocked position, the base is removable from the cover.

6. The solar cell carrying pod of claim 5, wherein the corresponding interface of the cover comprises one or more slots near a bottom portion of the cover.

7. The solar cell carrying pod of claim 6, wherein the rotating ring comprises at least four locking blades that interface with at least four corresponding slots distributed about the bottom portion of the cover adjacent the base when sealingly coupled thereto.

8. The solar cell carrying pod of claim 5, wherein the locking ring is engageable with a gear system within the base, wherein operation of the gear system rotates the locking ring between the locked and unlocked position.

9. The solar cell carrying of claim 8, wherein the gear system is collet-operated.

10. The solar cell carrying pod of claim 1, wherein the plenum includes an upper plenum adjacent the valve and a lower elongated plenum defined in part by the plenum diffuser.

11. The solar cell carrying pod of claim 1, wherein the plenum diffuser extends distally from the upper plenum and is pivotally coupled so as to pivot between the first and second positions.

12. The solar cell carrying pod of claim 11, wherein the plenum diffuser includes one or more pins extending distally from a distal end thereof, wherein the pins are adapted to engage the base when coupled to the cover such that engagement of the pins and the base pivot the pins to the second position.

13. A solar cell carrying pod comprising:
   a base having a collet-operated gear train,
   a lock operable within the base by the gear train;
   a cover removably coupled to the base, the cover being lockable to the base by operation of the lock;
   a solar cell carrier removably coupled between the base and cover, the carrier having an opening that cooperates with a collet inserted into the base, wherein expansion of the collet secures the carrier to the base; and
   a moveable gas plenum coupled to the carrier, wherein the gas plenum is moved by operation of the gear train to reduce a gap between the solar cell carrier and the gas plenum.

14. The solar cell carrying pod of claim 13, further comprising:

a seal between the base and cover, wherein the seal is adapted to maintain a sealed micro-environment of inert gas about the plurality of solar cells for a period of time when the base and the cover are locked with the carrier disposed within.

15. The solar cell carrying pod of claim 13, wherein the carrier is further adapted to support a plurality of solar cells within and includes one or more coupling features for removably coupling the carrier to the base such that, when coupled, removal of the base from the cover facilitates retraction of the carrier from the cover to facilitate loading or unloading of solar cells from the carrier.

16. A solar cell carrying pod comprising:
- a base having gear driven locking mechanism operable from an underside thereof,
- a cover removably coupled to base along an upper side thereof the cover being sealably lockable to the base by operation of the locking mechanism;
- a solar cell carrier cassette removably coupled between the base and cover, the cassette being removably coupleable to the base; and
- a plenum disposed within the cover, wherein the plenum includes a movable plenum diffuser that moves when the base is coupled to the cover to reduce a gap between the solar cell carrier and the gas plenum.

* * * * *